(12) United States Patent
Shishido et al.

(10) Patent No.: US 9,845,521 B2
(45) Date of Patent: *Dec. 19, 2017

(54) COPPER ALLOY

(75) Inventors: Hisao Shishido, Kobe (JP); Shinya Katsura, Shimonoseki (JP); Yasuhiro Aruga, Kobe (JP); Katsushi Matsumoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 890 days.

This patent is subject to a terminal disclaimer.

(21) Appl. No.: 13/299,828

(22) Filed: Nov. 18, 2011

(65) Prior Publication Data

US 2012/0148439 A1    Jun. 14, 2012

(30) Foreign Application Priority Data

Dec. 13, 2010 (JP) ................................. 2010-277081
Feb. 25, 2011 (JP) ................................. 2011-040393
Feb. 25, 2011 (JP) ................................. 2011-040394

(51) Int. Cl.
*C22C 9/06* (2006.01)
*C22C 9/02* (2006.01)
(Continued)

(52) U.S. Cl.
CPC .................. *C22C 9/06* (2013.01); *C22C 1/02* (2013.01); *C22F 1/08* (2013.01); *H01B 1/026* (2013.01); *H05K 1/09* (2013.01)

(58) Field of Classification Search
CPC .... C22C 9/00; C22C 9/02; C22C 9/04; C22C 9/06; C22C 1/02; C22F 1/08; H05K 1/09; H01B 1/026
(Continued)

(56) References Cited

U.S. PATENT DOCUMENTS 8,641,838 B2 * 2/2014 Kaneko et al. ............... 148/433
2006/0147742 A1    7/2006 Matsuda et al.
(Continued)

FOREIGN PATENT DOCUMENTS

EP    2 048 251 A1    4/2009
EP    2 248 922 A1    11/2010
(Continued)

OTHER PUBLICATIONS

Extended European Search Report dated Apr. 11, 2012, in Patent Application No. 11009294.7.
(Continued)

*Primary Examiner* — Keith Walker
*Assistant Examiner* — John Hevey
(74) *Attorney, Agent, or Firm* — Oblon, McClelland, Maier & Neustadt, L.L.P.

(57) ABSTRACT

A copper alloy containing Ni: 1.5%-3.6% and Si: 0.3%-1.0% in terms of mass percent with the remainder consisting of copper and unavoidable impurities, wherein: the average crystal grain size of the crystal grains in the copper alloy is 5 to 30 μm; the area ratio of the crystal grains having crystal grain sizes not less than twice the average crystal grain size is not less than 3%; and the ratio of the area of cube orientation grains to the area of the crystal grains having crystal grain sizes not less than twice the average crystal grain size is not less than 50%.

11 Claims, 1 Drawing Sheet

(51) Int. Cl.
*C22F 1/08* (2006.01)
*H01B 1/02* (2006.01)
*C22C 1/02* (2006.01)
*H05K 1/09* (2006.01)

(58) Field of Classification Search
USPC ........ 420/473, 476, 481, 485, 487, 488, 490
See application file for complete search history.

(56) References Cited

U.S. PATENT DOCUMENTS

| | | |
|---|---|---|
| 2008/0190523 A1 | 8/2008 | Gao et al. |
| 2008/0190524 A1 | 8/2008 | Gao et al. |
| 2008/0298998 A1 | 12/2008 | Kaneko et al. |
| 2009/0101243 A1 | 4/2009 | Aruga et al. |
| 2010/0047112 A1* | 2/2010 | Fugono et al. ............... 420/470 |
| 2010/0269959 A1 | 10/2010 | Gao et al. |
| 2011/0073221 A1 | 3/2011 | Kaneko et al. |
| 2011/0240180 A1* | 10/2011 | Gao et al. ..................... 148/554 |
| 2013/0255838 A1* | 10/2013 | Katsura ........................ 148/412 |
| 2014/0193293 A1* | 7/2014 | Shishido et al. ............. 420/473 |

FOREIGN PATENT DOCUMENTS

| | | |
|---|---|---|
| EP | 2 298 945 A1 | 3/2011 |
| JP | 9-235635 A | 9/1997 |
| JP | 2006-152392 | 6/2006 |
| JP | 2006-155899 A | 6/2006 |
| JP | 2006-219733 A | 8/2006 |
| JP | 2008-13836 | 1/2008 |
| JP | 2008-223136 | 9/2008 |
| JP | 2009-7666 | 1/2009 |
| JP | 2010-90408 A | 4/2010 |
| JP | 2010-275622 | 12/2010 |
| JP | 2011-12321 | 1/2011 |
| JP | 2011-162848 | 8/2011 |
| WO | WO 2009/148101 A1 | 12/2009 |

OTHER PUBLICATIONS

U.S. Appl. No. 13/798,657, filed Mar. 13, 2013, Katsura, et al.
Office Action dated Jan. 31, 2012 in European Patent Application No. 11009294.7-2122.
"Basic and Engineering of Copper and Copper Alloy", Japan Copper and Brass Association, 1988, 20 pages (with Partial English translation).

* cited by examiner

COPPER ALLOY

FIELD OF THE INVENTION

The present invention relates: to a copper alloy having not only a good electric conductivity but also a high strength, an excellent bending workability, and an excellent stress relaxation resistance; in particular to a copper alloy for an electric/electronic part that can be preferably used for a current-carrying component such as a connector, a lead frame, a relay, or a switch constituting an electric/electronic part.

BACKGROUND OF THE INVENTION

A copper alloy material used for a current-carrying component such as a connector, a lead frame, a relay, or a switch constituting an electric/electronic part is required to have a good electric conductivity in order to inhibit Joule heat from being generated by applying electric current and a high strength of the extent of withstanding stress imposed during the assembly or the activation of an electric/electronic part. Further, an electric/electronic part is generally formed by bending and an excellent bending workability is also requited of a material for an electric/electronic part subjected to bending. Furthermore, in order to secure contact reliability of an electric/electronic part, a material is required to be excellent in resistance to stress relaxation that is a phenomenon of lowering a contact pressure with the lapse of time, namely durability to stress relaxation.

As a method of strengthening a material used for such a current-carrying component, a method of adding a solute element such as Ni or Si abundantly, a method of repeating annealing and rolling during production, a method of increasing a finish reduction (temper treatment) ratio after aging treatment, and the like are generally known. The abundant addition of a solute element such as Ni or Si however causes the problems of increasing Ni—Si system inclusions and deteriorating bending workability. Further, the method of increasing a finish reduction (temper treatment) ratio causes the problems of lowering a cube orientation area ratio and also deteriorating bending workability.

Further, as a method of improving the bending workability of a material used for a current-carrying component, a method of lowering a finish reduction (temper treatment) ratio, a method of micronizing a crystal grain size, a method of increasing a cube orientation area ratio, and the like are generally known. If a crystal grain size is micronized however, the problem of deteriorating stress relaxation resistance is caused.

Moreover, as a method of improving the stress relaxation resistance of a material used for a current-carrying component, a method of lowering a finish reduction (temper treatment) ratio, a method of coarsening a crystal grain size, and the like are generally known.

Consequently, it can be said that, even when various conventional technologies are used, it is very difficult to simultaneously obtain the high strength, the improvement of the bending workability, and the improvement of the stress relaxation resistance of a material used for a current-carrying component constituting an electric/electronic part. As a result, a method of appropriately balancing the above characteristics in consideration of the characteristics required of a produced individual current-carrying component has heretofore had to be adopted. Among copper alloys in particular, a Corson alloy (Cu—Ni—Si system copper alloy) is recently adopted widely as a copper alloy material suitable for a current-carrying component constituting an electric/electronic part since the alloy is excellent in the above various characteristics and less expensive.

In recent years further, the downsizing and weight reduction of an electronic device advance and in particular the enhancement of strength and the reduction of thickness tend to be increasingly required of a copper alloy material used for a terminal/connector. As a result, with regard to strength, from the viewpoint of contact pressure strength in particular, a high 0.2% proof stress (YP) in the direction perpendicular to a rolling direction (T. D. direction) tends to be required.

A specific characteristic of a Corson alloy however is that the difference in strength is large between in the direction parallel with a rolling direction (L. D. direction) and in the direction perpendicular to a rolling direction (T. D. direction), namely the strength in the direction perpendicular to a rolling direction is relatively lower than the strength in the direction parallel with a rolling direction. Another characteristic is that the difference between a tensile strength (TS) and a 0.2% proof stress (YP) is large. Consequently, when a Corson alloy is used for a terminal/connector, the problems of lowering a proof stress in the direction perpendicular to a rolling direction and lacking contact pressure strength are caused.

In recent years, various methods are proposed for improving the bending workability of a Corson alloy. In JP-A No. 2006-152392 for example, as a method effective in improving the bending workability of a Corson alloy, a technology of controlling the texture of crystal grains is proposed. In JP-A No. 2006-152392, disclosed is a copper alloy plate that: comprises a Corson alloy containing Ni by 2.0 to 6.0 mass % and Si in the range of 4 to 5 in terms of an Ni/Si mass ratio; has a texture wherein the average crystal grain size is controlled to not larger than 10 μm and the proportion of the cube orientation $\{001\}<100>$ is not less than 50% in the measurement result by an SEM-EBSP method; and does not have a lamellar boundary observable by texture observation with an optical microscope of 300 magnifications.

In JP-A No. 2009-7666 further, described is a proposal on a copper alloy for an electric/electronic device having $R\{200\}$ of 0.3 or more when a diffraction intensity from a $\{111\}$ plane is defined as $I\{111\}$, a diffraction intensity from a $\{200\}$ plane is defined as $I\{200\}$, a diffraction intensity from a $\{220\}$ plane is defined as $I\{220\}$, a diffraction intensity from a $\{311\}$ plane is defined as $I\{311\}$, and the ratio of the diffraction intensity from the $\{200\}$ plane in the diffraction intensities is defined as $R\{200\}=I\{200\}/(I\{111\}+I\{200\}+I\{311\})$ on the surface of a copper alloy material containing Ni by 0.5 to 4.0 mass %, Co by 0.5 to 2.0 mass %, and Si by 0.3 to 1.5 mass %.

In JP-A No. 2008-13836 further, described is a proposal on a copper alloy plate material retaining a high strength and an excellent bending workability of a Corson alloy and simultaneously having improved anisotropies of those characteristics by satisfying the expressions $3.0 \leq I\{220\}/I0\{220\} \leq 6.0$ and $1.5 \leq I\{200\}/I0\{200\} \leq 2.5$ in a copper alloy plate material containing Ni by 0.7% to 2.5% and Si by 0.2% to 0.7% in terms of mass %.

In JP-A No. 2008-223136 further, described is a proposal on a copper alloy plate material retaining a high strength and a high electric conductivity and simultaneously exhibiting excellent bending workability and stress relaxation resistance by satisfying the expression $I\{420\}/I0\{420\}>1.0$ in a copper alloy plate material containing Ni by 0.7% to 4.2% and Si by 0.2% to 1.0% in terms of mass %.

In JP-A No. 2010-275622 further, described is a proposal on a copper alloy plate material retaining a high strength, simultaneously having an excellent bending workability of low anisotropy, and also having an excellent stress relaxation resistance by having a crystalline orientation satisfying the expression I{200}/I0{200}≥1.0 when the X-ray diffraction intensity of a {200} crystal plane on a plane of a copper alloy plate containing Ni by 0.7 to 4.0 mass % and Si by 0.2 to 1.5 mass % is defined as I{200} and the X-ray diffraction intensity of a {200} crystal plane of pure copper standard powder is defined as I0{200}.

SUMMARY OF THE INVENTION

The present invention has been established in view of the above conventional circumstances and a challenge of the present invention is to provide a copper alloy having not only a good electric conductivity but also a high strength, an excellent bending workability, and an excellent stress relaxation resistance simultaneously.

Invention according to Claim 1 is a copper alloy containing Ni: 1.5%-3.6% and Si: 0.3%-1.0% in terms of mass percent with the remainder consisting of copper and unavoidable impurities, wherein: the average crystal grain size of the crystal grains in the copper alloy is 5 to 30 μm; the area ratio of the crystal grains having crystal grain sizes not less than twice the average crystal grain size is not less than 3%; and the ratio of the area of cube orientation grains to the area of the crystal grains having crystal grain sizes not less than twice the average crystal grain size is not less than 50%.

Invention according to Claim 2 is a copper alloy according to Claim 1, wherein the copper alloy further contains Sn: 0.05%-3.0% and/or Zn: 0.05%-3.0% in terms of mass percent.

Invention according to Claim 3 is a copper alloy according to Claim 1 or 2, wherein the copper alloy further contains one or more elements selected from the group consisting of Fe, Mn, Mg, Co, Ti, Cr, and Zr by 0.01%-3.0% in terms of mass percent in total.

Invention according to Claim 4 is a copper alloy containing Ni: 1.5%-3.6% and Si: 0.3%-1.0% in terms of mass percent with the remainder consisting of copper and unavoidable impurities, wherein: the average crystal grain size of the copper alloy is 15 to 40 μm; the average area ratio in cube orientation {001}<100> is not less than 45% as a result of measurement by an SEM-EBSP method; and a KAM value is 1.0-3.0.

A copper alloy according to Claim 5 is a copper alloy according to Claim 4, wherein the copper alloy further contains Sn: 0.05%-3.0% and/or Zn: 0.05%-3.0% in terms of mass percent.

A copper alloy according to Claim 6 is a copper alloy according to Claim 4 or 5, wherein the copper alloy further contains one or more elements selected from the group consisting of Fe, Mn, Mg, Co, Ti, Cr, and Zr by 0.01%-3.0% in terms of mass percent in total.

A copper alloy according to Claim 7 is a copper alloy containing Ni: 2.0%-3.6%, Si: 0.4%-1.0%, Sn: 0.05%-1.5%, and Zn: 0.05%-3.0% in terms of mass percent with the remainder consisting of copper and unavoidable impurities, wherein: the average crystal grain size of the copper alloy is 10 to 40 μm; the average area ratio in cube orientation {001}<100> is not less than 20% as a result of measurement by an SEM-EBSP method; the difference in area ratio in cube orientation between a ¼t (t represents sheet thickness) part and a ½t part is within 5%; and a KAM value is not less than 1.00 to not more than 3.00.

A copper alloy according to Claim 8 is a copper alloy according to Claim 7, wherein the copper alloy further contains one or more elements selected from the group consisting of Fe, Mn, Mg, Co, Ti, Cr, and Zr by 0.01%-3.0% in terms of mass percent in total.

Here, in the explanations below, a copper alloy according to any one of Claims 1 to 3 is referred to as a first copper alloy, a copper alloy according to any one of Claims 4 to 6 is referred to as a second copper alloy, and a copper alloy according to any one of Claims 7 and 8 is referred to as a third copper alloy.

The present invention makes it possible to obtain a high strength copper alloy having not only a good electric conductivity that is a characteristic of a copper alloy but also a high strength, an excellent bending workability, and an excellent stress relaxation resistance simultaneously, namely being excellent in bending workability and stress relaxation resistance.

DETAILED DESCRIPTION OF THE PREFERRED EMBODIMENTS

<First Copper Alloy>

Figure 1:
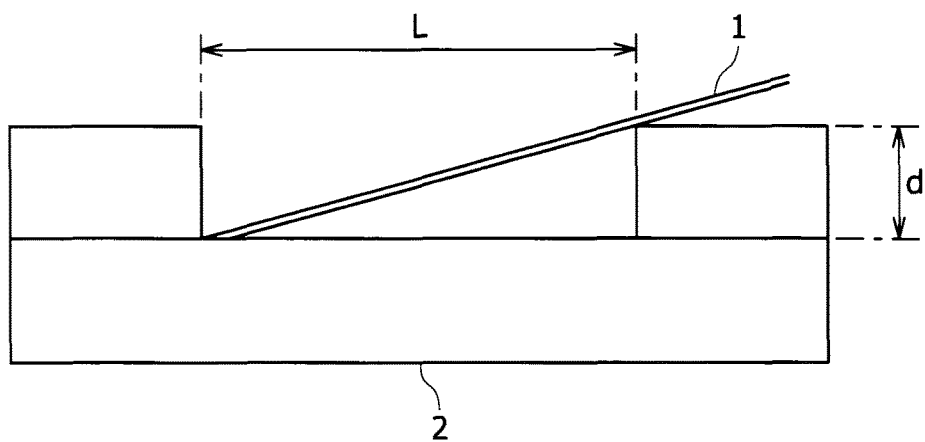
FIG. 1 is a front view showing a test method for obtaining the stress relaxation resistance of a copper alloy in the state of applying an amount of deflection to a strip-shaped specimen in an example.

A first copper alloy according to the present invention is explained hereunder.

A method most effective as a method for strengthening a copper alloy is a method of increasing a finish reduction (temper treatment) ratio. If a finish reduction (temper treatment) ratio increases however, that inversely causes the bending workability and stress relaxation resistance of a copper alloy to deteriorate. Meanwhile, a means most effective for improving stress relaxation resistance is to increase the crystal grain size of a copper alloy. If the crystal grain size increases however, that inversely causes the bending workability of a copper alloy to deteriorate. Consequently, if it is intended to obtain a copper alloy having various characteristics such as strength, bending workability, and stress relaxation resistance by a conventional technology, only a possible method is to adopt a method of appropriately balancing strength, bending workability, and stress relaxation resistance by controlling a finish reduction (temper treatment) ratio and a crystal grain size and it has been impossible to obtain a copper alloy having contradictory characteristics such as a high strength, an excellent bending workability, and an excellent stress relaxation resistance simultaneously.

The present inventors, in view of the conventional problems, have earnestly advanced experiment and research in order to obtain a copper alloy having a high strength, an excellent bending workability, and an excellent stress relaxation resistance simultaneously.

The present inventors have perceived the crystal grain size of a copper alloy as an important factor for obtaining a copper alloy having a high strength, an excellent bending workability, and an excellent stress relaxation resistance simultaneously and started studying. As a result, the present inventors have found that intergranular cracking during bending that occurs when only coarse crystal grains exist can be inhibited by mixing fine crystal grains and moderately coarse crystal grains in the crystal grain texture of a copper alloy. Further, the present inventors have found that an excellent stress relaxation resistance can be obtained by increasing the sizes of some crystal grains in a copper alloy.

Furthermore, the present inventors, as a result of precisely investigating a crystal grain size and a crystal orientation with an SEM-EBSP, have found that bending workability improves particularly by dispersing an appropriate quantity of relatively coarse cube orientation grains in the crystal grain texture of a copper alloy. Here, it is estimated that the cube orientation grains are orientation grains having more slip systems than other orientation grains and for that reason bending workability does not deteriorate even when comparatively coarse cube orientation grains exist to some extent.

The present inventors, as a result of the findings by the above experiment and research, have found that a copper alloy having a high strength, an excellent bending workability, and an excellent stress relaxation resistance simultaneously, which are the challenges of the present invention, can be obtained by: setting the average crystal grain size of the crystal grains in the copper alloy at 5 to 30 μm; further setting the area ratio of the crystal grains having crystal grain sizes not less than twice the average crystal grain size in a crystal grain texture at not less than 3%; and moreover making cube orientation grains account for not less than 50% of the crystal grains having crystal grain sizes not less than twice the average crystal grain size.

Embodiments of the first copper alloy are hereunder explained specifically for each requirement and firstly requirements on the crystal grain texture of the first copper alloy are explained in sequence.

(Average Crystal Grain Size)

The average crystal grain size of a copper alloy is set at 5 to 30 μm. If an average crystal grain size is less than 5 μm, stress relaxation resistance deteriorates. On the other hand, if an average crystal grain size exceeds 30 μm, the bending workability of a copper alloy deteriorates and for example is rated as poor as D or lower in the evaluation criteria described in JBMA-T307 of Japan Copper and Brass Association Technical Standard. Consequently the lower limit of the average crystal grain size of a copper alloy is set at 5 μm and the upper limit thereof is set at 30 μm. Here, a preferable lower limit of the average crystal grain size is 8 μm and a preferable upper limit thereof is 25 μm.

(Area Ratio of Crystal Grains Having Crystal Grain Sizes not Less than Twice the Average Crystal Grain Size)

If the area ratio of the crystal grains having crystal grain sizes not less than twice the average crystal grain size (the area of the total crystal grains having crystal grain sizes not less than twice the average crystal grain size/the area of the total crystal grains) is less than 3%, an excellent stress relaxation resistance and an excellent bending workability cannot be obtained simultaneously. Consequently, the lower limit of the area ratio of the crystal grains having crystal grain sizes not less than twice the average crystal grain size is set at 3%. A preferable lower limit is 5%. On the other hand, it is estimated that stress relaxation resistance and bending workability simultaneously improve more effectively as the area ratio of the crystal grains having crystal grain sizes not less than twice the average crystal grain size increases but it is substantially difficult by the present technologies to increase the area ratio of the crystal grains having crystal grain sizes not less than twice the average crystal grain size to more than 20%.

(Area Ratio of Cube Orientation Grains)

The cube orientation {001}<100> is an orientation where more slip systems can be active. By setting the ratio of the area of cube orientation grains to the area of the crystal grains having crystal grain sizes not less than twice the average crystal grain size (the area of cube orientation grains having crystal grain sizes not less than twice the average crystal grain size/the area of the total crystal grains having crystal grain sizes not less than twice the average crystal grain size) at not less than 50%, it is possible to improve the bending workability of a copper alloy. If the area ratio is less than 50%, the bending workability of a copper alloy deteriorates and for example is rated as poor as D or lower in the evaluation criteria described in JBMA-T307 of Japan Copper and Brass Association Technical Standard. A preferable area ratio of cube orientation grains is 70% or more.

(Methods for Measuring Average Crystal Grain Size and Texture)

In the present invention, a texture of the surface part of a product copper alloy in the thickness direction is measured and a crystal grain size is measured by a crystal orientation analysis method with a field emission scanning electron microscope (FESEM) on which an electron back scattering (scattered) pattern (EBSP) system is mounted.

In an EBSP method, a specimen set in the lens tube of an FESEM is irradiated with an electron beam and an EBSP is projected on a screen. The EBSP is taken with a highly sensitive camera and taken in a computer as an image. In the computer, the image is analyzed and a crystal orientation is determined by comparing with a pattern obtained through simulation with a known crystal system. A computed crystal orientation is recorded as a three-dimensional Euler angle together with a positional coordinate (x, y), etc. The process is automatically applied to all measurement points and hence tens of thousands to hundreds of thousands of crystal orientation data can be obtained at the end of the measurement.

Meanwhile, in the case of an ordinary copper alloy plate, a texture mainly comprising many orientation factors called a cube orientation, a Goss orientation, a brass orientation, a copper orientation, an S orientation, etc. as shown below is formed and crystal planes corresponding to those orientations exist. The facts are described for example in "Texture" written and edited by Shinichi Nagashima, published by Maruzen Co., Ltd., "Light Metal" Explanation Vol. 43, 1993, P285-293 by Japan Institute of Light Metals, etc. The shapes of the textures vary in accordance with methods of processing and heat treatment even in the case of an identical crystal system. In the case of the texture of a plate material formed by rolling, the texture is expressed with a rolling plane and a rolling direction, and a rolling plane is expressed with {ABC} and a rolling direction is expressed with <DEF> (each of A, B, C, D, E, and F represents an integer). On the basis of the expressions, the orientations are expressed as follows.

Cube orientation {001}<100>
Goss orientation {011}<100>
Rotated-Goss orientation {011}<011>
Brass orientation {011}<211>
Copper orientation {112}<111>
(or D orientation {4411}<11118>
S orientation {123}<634>
B/G orientation {001}<511>
B/S orientation {168}<211>
P orientation {011}<111>

In the present invention, basically a crystal plane having an orientation the deviation of which from each of the above crystal planes is within ±15° is regarded as a crystal plane belonging to the relevant crystal plane (orientation factor). Then a boundary of adjacent crystal grains the orientation difference of which is 5° or more is defined as a crystal grain boundary.

On the basis of the above premises, in the present invention, a measurement area of 300×300 μm is irradiated at intervals of 0.5 μm with an electron beam and an average crystal grain size is computed with the expression (Σx)/n when the number of the crystal grains measured by the above crystal orientation analysis method is defined as n and each of the measured crystal grain sizes is defined as x.

Further, an area ratio of crystal grains having crystal grain sizes not less than twice the average crystal grain size is obtained by: irradiating a measurement area of 300×300 μm at intervals of 0.5 μm with an electron beam; obtaining the total area of relevant crystal grains; and computing with the expression (the area of all crystal grains having crystal grain sizes not less than twice the average crystal grain size/the area of all crystal grains).

Furthermore, the ratio of the area of cube orientation grains to the area of the crystal grains having crystal grain sizes not less than twice the average crystal grain size is obtained by: irradiating a measurement area of 300×300 μm at intervals of 0.5 μm with an electron beam; measuring the area of relevant cube orientation grains measured by the above crystal orientation analysis method; and computing with the expression (the area of cube orientation grains having crystal grain sizes not less than twice the average crystal grain size/the area of all crystal grains having crystal grain sizes not less than twice the average crystal grain size).

Here, a crystal orientation may possibly distribute in the plate thickness direction. Consequently, it is preferable to obtain a crystal orientation by taking data at arbitrary several points in the plate thickness direction and averaging the data.

(Chemical Component Composition of Copper Alloy)

The reasons for limiting components of a first copper alloy are explained hereunder. The content (ratio) of each element below is described merely as % but % means mass % in all cases.

Ni: 1.5%-3.6%

Ni has the functions of securing the strength and electric conductivity of a copper alloy by crystallizing or precipitating a chemical compound with Si. If an Ni content is less than 1.5%, the quantity of generated precipitates is insufficient, an intended strength is not obtained, and crystal grains in a copper alloy texture coarsen undesirably. On the other hand, if an Ni content exceeds 3.6%, electric conductivity deteriorates, the number of coarse precipitates increases excessively, and bending workability deteriorates. Consequently, an Ni content is set in the range of 1.5%-3.6%.

Here, an attainable strength level varies in accordance with an Ni content. When an Ni content is 1.5%-less than 2.0%, it is possible to attain both a 0.2% proof stress (YP) in the direction perpendicular to a rolling direction (T. D. direction) of not less than 650 MPa and a bending workability of B or higher in the evaluation criteria described in JBMA-T307 of Japan Copper and Brass Association Technical Standard. On the other hand, when an Ni content is 2.0%-3.6%, it is possible to attain both a 0.2% proof stress (YP) in the direction perpendicular to a rolling direction (T. D. direction) of not less than 700 MPa and a bending workability of C or higher in the evaluation criteria described in JBMA-T307 of Japan Copper and Brass Association Technical Standard.

Si: 0.3%-1.0%

Si improves the strength and electric conductivity of a copper alloy by crystallizing or precipitating a chemical compound with Ni. If an Si content is less than 0.3%, the generation of precipitates is insufficient, an intended strength is not obtained, and crystal grains in a copper alloy texture coarsen undesirably. On the other hand, if an Si content exceeds 1.0%, the number of coarse precipitates increases excessively and bending workability deteriorates. Consequently, an Si content is set in the range of 0.3%-1.0%.

Here, an attainable strength level varies in accordance with an Si content too. When an Si content is 0.3%-less than 0.5%, it is possible to attain both a 0.2% proof stress (YP) in the direction perpendicular to a rolling direction (T. D. direction) of not less than 650 MPa and a bending workability of B or higher in the evaluation criteria described in JBMA-T307 of Japan Copper and Brass Association Technical Standard. On the other hand, when an Si content is 0.5%-1.0%, it is possible to attain both a 0.2% proof stress (YP) in the direction perpendicular to a rolling direction (T. D. direction) of not less than 700 MPa and a bending workability of C or higher in the evaluation criteria described in JBMA-T307 of Japan Copper and Brass Association Technical Standard.

A copper alloy according to the present invention comprises, besides the above elements, copper and unavoidable impurities but the following elements may be contained individually or in combination.

Zn: 0.05%-3.0%

Zn is an element effective in improving the thermal exfoliation resistance of Sn plating and solder used for bonding an electronic component and inhibiting thermal exfoliation. In order to exhibit the effects effectively, Zn has to be contained by 0.05% or more. If a Zn content exceeds 3.0% however, the wet-spreadability of molten Sn and solder rather deteriorates and electric conductivity deteriorates largely. Consequently, when Zn is contained, a Zn content is set in the range of 0.05%-3.0% in consideration of thermal exfoliation resistance improvement effect and electric conductivity deterioration function.

Sn: 0.05%-3.0%

Sn dissolves in a copper alloy and contributes to the improvement of strength. In order to exhibit the effects effectively, Sn has to be contained by 0.05% or more. If an Sn content exceeds 3.0% however, the effects are saturated and electric conductivity deteriorates largely. Consequently, when Sn is contained, an Sn content is set in the range of 0.05%-3.0% in consideration of strength improvement effect and electric conductivity deterioration function.

One or More Elements of Fe, Mn, Mg, Co, Ti, Cr, and Zr: 0.01%-3.0% in Total

Those elements have the effect of micronizing crystal grains. Further, by forming a chemical compound with Si, strength and electric conductivity improve. In order to exhibit the effects effectively, it is necessary to selectively contain one or more elements of Fe, Mn, Mg, Co, Ti, Cr, and Zr by 0.01% or more in total. If the total content of those elements exceeds 3.0% however, a chemical compound coarsens and bending workability is hindered. Consequently, when those elements are contained selectively, the content of those elements is set in the range of 0.01% to 3.0% in total.

(Production Conditions)

A first copper alloy (copper alloy plate) can be produced through the processes of hot rolling, cold rolling, solution treatment, aging treatment, and cold rolling in the same way as the case of producing an ordinary copper alloy. The present inventors have earnestly studied the production conditions for producing a first copper alloy and resultantly verified that a copper alloy simultaneously having a high strength, an excellent bending workability, and an excellent stress relaxation resistance, which are intended in the present invention, can be produced particularly by contriving a hot rolling process. The production conditions are hereunder explained in detail.

Here, a first copper alloy is basically a rolled copper alloy plate and a strip formed by slitting it in the width direction and a substance formed by coiling the plate or the strip are also included in the first copper alloy.

In a hot rolling process, it is desirable that a copper alloy is retained in the temperature range of 400° C. to 600° C. for 10 min. or longer during cooling after the end of hot rolling and successively rapidly cooled. If a retention temperature is lower than 400° C. or higher than 600° C. or a retention time is less than 10 min., the area ratio of crystal grains having crystal grain sizes not less than twice the average crystal grain size is likely to be less than 3%. Further, the ratio of the area of cube orientation grains to the area of the crystal grains having crystal grain sizes not less than twice the average crystal grain size is likely to be less than 50%. On that occasion, bending workability and stress relaxation resistance cannot be simultaneously improved.

It is desirable that a temperature increase rate is 0.1° C./s or less and a temperature decrease rate is 100° C./s or more in succeeding solution treatment. If a temperature increase rate is more than 0.1° C./s, the area ratio of the crystal grains having crystal grain sizes not less than twice the average crystal grain size may sometimes be less than 3% and, on that occasion, bending workability and stress relaxation resistance cannot be simultaneously improved. On the other hand, if a temperature decrease rate is less than 100° C./s, precipitation may sometimes occur during cooling and, on that occasion, sufficient precipitation is not obtained and strength reduction is caused in succeeding aging treatment.

Further, it is desirable that a solution treatment temperature is 750° C. to 900° C. If a solution treatment temperature is lower than 750° C., the average crystal grain size of crystal grains is likely to be smaller than 5 μm and stress relaxation resistance is likely to deteriorate. On the other hand, if a solution treatment temperature is higher than 900° C., the average crystal grain size of crystal grains is likely to be larger than 30 μm and bending workability is likely to deteriorate.

A first copper alloy is produced by, after solution treatment, undergoing the processes of aging treatment, final cold rolling, (and low temperature annealing) in the same way as the production processes of an ordinary copper alloy. It is desirable that an aging temperature at aging treatment is 400° C. to 550° C. in the same way as the case of producing an ordinary copper alloy.

Further, it is desirable that a reduction ratio in final cold rolling is 25% to 60%. If a reduction ratio is less than 25%, 0.2% proof stress (YP) in the direction perpendicular to a rolling direction (T. D. direction) lowers and strength is likely to lower. On the other hand, if a reduction ratio exceeds 60%, it sometimes happens that a sufficient bending workability is not obtained.

<Second Copper Alloy>

A second copper alloy according to the present invention is explained hereunder.

The present inventors, on the basis of a conventional method for strengthening a copper alloy stated above, have focused spotlight on a KAM (Kernel Average Misorientation) value having correlation with a dislocation density, precisely investigated a KAM value with an SEM-EBSP, and resultantly found that the reduction ratio of final cold rolling necessary for strengthening a copper alloy can be estimated.

Further, the present inventors have precisely investigated a texture before and after final cold rolling in the production processes of a copper alloy with an SEM-EBSP and found that many crystal grains retaining crystal orientations before rolling remain even after the copper alloy is subjected to rolling. That is, it is verified that, if the area ratio in cube orientation {001}<100> is large before final cold rolling, the area ratio in the cube orientation can be kept at a high level after final cold rolling. Although the final reduction ratio is controlled at a low level in order to control a texture in the technologies described in JP-A Nos. 2006-152392 and 2009-7666 shown earlier, the present inventors have found that the area ratio in cube orientation can be increased even when a final reduction ratio is increased by applying solution treatment twice repeatedly and then contriving the solution treatment method in the production processes of a copper alloy.

Further, it has been found that the area ratio in cube orientation can be increased as a crystal grain size increases. It has been verified that, in the case where a crystal grain size is not more than 40 μm in particular, the contribution of the increase in the area ratio in cube orientation to the improvement of bending workability exceeds the contribution of the coarsening of crystal grains to the deterioration of bending workability. Consequently, it has been found that bending workability can be retained sufficiently even when a crystal grain size is increased up to a certain size (40 μm) in order to improve stress relaxation resistance. Here, a crystal grain size can be increased by contriving a solution treatment method.

As a result of the findings through the above experiment and research, the present inventors have found that a copper alloy simultaneously having a high strength, an excellent bending workability, and an excellent stress relaxation resistance, which are the challenges of the present invention, can be obtained by: setting the average crystal grain size of the copper alloy at 15 to 40 μm; setting the average area ratio in cube orientation {001}<100> at not less than 45% as a result of measurement by an SEM-EBSP method; and moreover setting a KAM value at 1.0-3.0.

Embodiments of the second copper alloy are hereunder explained specifically for each requirement and firstly requirements on the texture of the second copper alloy are explained in sequence. Here, in the following explanations, when an average crystal grain size and an average area ratio in a texture are described, the term "average" may be omitted and merely a crystal grain size and an area ratio may be described occasionally.

(Average Crystal Grain Size)

The average crystal grain size of a copper alloy is set at 15 to 40 μM. If a crystal grain size is not more than 40 μm, the extent of the contribution of the increase in the area ratio in cube orientation to the improvement of bending workability exceeds the extent of the contribution of the coarsening of crystal grains to the deterioration of bending workability and the bending workability of a copper alloy improves. If a crystal grain size exceeds 40 μm however, the contribution of the coarsening of crystal grains comes to be predominant and bending workability deteriorates. Consequently, the upper limit of a crystal grain size is set at 40 μm. A preferable crystal grain size is 30 μm or less. On the other hand, if a crystal grain size is less than 15 μm, stress relaxation resistance deteriorates.

(Average Area Ratio in Cube Orientation)

The cube orientation {001}<100> is an orientation where more slip systems can be active. By accumulating the cube orientation by 45% or more in terms of area ratio, it comes to be possible to inhibit local deformation from developing and improve the bending workability of a copper alloy. If the accumulation ratio (area ratio) of cube orientation grains is too low, local deformation cannot be inhibited from developing and the bending workability of a copper alloy deteriorates. Consequently in the present invention, the average area ratio in cube orientation {001}<100>> is set at 45% or more and preferably 50% or more. On the other hand, the average area ratio in cube orientation tends to increase as the crystal grain size of a copper alloy increases. For that reason, it is estimated that the area ratio in cube orientation is hardly set at 70% or more as long as the crystal grain size with which an excellent bending workability can be obtained is in the range of 40 μm or less. Consequently, a substantial range of the area ratio in cube orientation is 45% to 70%.

(KAM Value)

A KAM value is set at 1.0 to 3.0. If a KAM value is less than 1.0, a dislocation density is insufficient and hence proof stress decreases considerably in comparison with tensile strength. As a result, the proof stress in the direction perpendicular to the rolling direction decreases undesirably. Meanwhile, if a KAM value is larger than 3.0, a dislocation density increases excessively and bending workability deteriorates undesirably.

(Measurement Methods of Average Crystal Grain Size and Texture)

The measurement methods of an average crystal grain size and a texture are similar to the measurement methods in the first copper alloy.

(Measurement Method of KAM Value)

A KAM value is obtained by measuring orientation difference in crystal grains with an EBSP. A KAM value is defined with the expression $(\Sigma y)/n$ when the number of crystal grains is represented by n and an orientation difference of crystal grains individually measured is represented by y. It is reported that a KAM value is correlated with a dislocation density and the fact is reported for example in "Material" (Journal of the Society of Materials Science, Japan) Vol. 58, No. 7, P568-574, July 2009.

(Chemical Component Composition of Copper Alloy)

The reasons for limiting components of a second copper alloy are explained hereunder. The content of each element below is described merely as % but % means mass % in all cases.

Ni: 1.5%-3.6%

Ni has the functions of securing the strength and electric conductivity of a copper alloy by crystallizing or precipitating a chemical compound with Si. If an Ni content is less than 1.5%, the quantity of generated precipitates is insufficient, an intended strength is not obtained, and crystal grains in a copper alloy texture coarsen undesirably. On the other hand, if an Ni content exceeds 3.6%, electric conductivity deteriorates, the number of coarse precipitates increases excessively, and bending workability deteriorates. Consequently, an Ni content is set in the range of 1.5%-3.6%.

Here, the strength level of a copper alloy varies in accordance with an Ni content. When an Ni content is 1.5% or more to less than 2.0%, a 0.2% proof stress (YP) in the direction perpendicular to a rolling direction (T. D. direction) is not less than 650 MPa. On this occasion, bending workability is rated as A to B in the evaluation criteria described in JBMA-T307 of Japan Copper and Brass Association Technical Standard. Then, when an Ni content is 2.0%-3.6%, a 0.2% proof stress (YP) in the direction perpendicular to a rolling direction (T. D. direction) is not less than 700 MPa. On this occasion, bending workability is rated as A to C in the evaluation criteria described in JBMA-T307 of Japan Copper and Brass Association Technical Standard.

Si: 0.3%-1.0%

Si improves the strength and electric conductivity of a copper alloy by crystallizing or precipitating a chemical compound with Ni. If an Si content is less than 0.3%, the generation of precipitates is insufficient, an intended strength is not obtained, and crystal grains in a copper alloy texture coarsen undesirably. On the other hand, if an Si content exceeds 1.0%, the number of coarse precipitates increases excessively and bending workability deteriorates. Consequently, an Si content is set in the range of 0.3%-1.0%.

Here, the strength level of a copper alloy varies in accordance with an Si content. When an Si content is 0.3% or more to less than 0.5%, a 0.2% proof stress (YP) in the direction perpendicular to a rolling direction (T. D. direction) is not less than 650 MPa. On this occasion, bending workability is rated as A to B in the evaluation criteria described in JBMA-T307 of Japan Copper and Brass Association Technical Standard. Then, when an Si content is 0.5%-1.0%, a 0.2% proof stress (YP) in the direction perpendicular to a rolling direction (T. D. direction) is not less than 700 MPa. On this occasion, bending workability is rated as A to C in the evaluation criteria described in JBMA-T307 of Japan Copper and Brass Association Technical Standard.

A second copper alloy comprises, besides the above elements, copper and unavoidable impurities but the following elements may be contained individually or in combination.

Zn: 0.05%-3.0%

Zn is an element effective in improving the thermal exfoliation resistance of Sn plating and solder used for bonding an electronic component and inhibiting thermal exfoliation. In order to exhibit the effects effectively, Zn has to be contained by 0.05% or more. If a Zn content exceeds 3.0% however, the wet-spreadability of molten Sn and solder rather deteriorates and electric conductivity also deteriorates largely. Consequently, a Zn content is set in the range of 0.05%-3.0% in consideration of thermal exfoliation resistance improvement effect and electric conductivity deterioration function.

Sn: 0.05%-3.0%

Sn dissolves in a copper alloy and contributes to the improvement of strength. In order to exhibit the effects effectively, Sn has to be contained by 0.05% or more. If an Sn content exceeds 3.0% however, the effects are saturated and electric conductivity lowers largely. Consequently, an Sn content is set in the range of 0.05%-3.0% in consideration of strength improvement effect and electric conductivity deterioration function.

One or More Elements of Fe, Mn, Mg, Co, Ti, Cr, and Zr: 0.01%-3.0% in Total

Those elements have the effect of micronizing crystal grains. Further, by forming a chemical compound with Si, strength and electric conductivity improve. In order to exhibit the effects effectively, it is necessary to selectively contain one or more elements of Fe, Mn, Mg, Co, Ti, Cr, and Zr by 0.01% or more in total. If the total content of those elements exceeds 3.0% however, a chemical compound coarsens and bending workability is hindered. Consequently, when those elements are contained selectively, the content of those elements is set in the range of 0.01% to 3.0% in total. Here, although the case of containing only one kind of the elements is referred to in the examples described below, the elements commonly exhibit the effects and similar effects are exhibited even when two or more kinds of the elements are contained within the total content range described above.

(Production Conditions)

In order to produce a second copper alloy (copper alloy plate), it is necessary to apply solution treatment twice repeatedly and moreover variously contrive a solution treatment method in a series of production processes of the copper alloy. The serial production processes are explained in the process sequence of hot rolling, cold rolling, solution treatment (first), cold rolling, solution treatment (second), aging treatment, and cold rolling. On this occasion, solution treatment may be repeated twice. In order to produce a second copper alloy, it is necessary to variously contrive and precisely control the solution treatment (first and second) in the serial processes.

In the solution treatment (both first and second), a temperature increase rate is set at 0.1° C./s or less and a temperature decrease rate is set at 100° C./s or more. If a temperature increase rate is more than 0.1° C./s, the area ratio in cube orientation in a copper alloy can hardly be 45% or more and bending workability lowers to D or lower in the evaluation criteria described in JBMA-T307 of Japan Copper and Brass Association Technical Standard. On the other hand, if a temperature decrease rate is less than 100° C./s, precipitation occurs during cooling, sufficient precipitation is not obtained in a succeeding aging treatment, and the strength of a copper alloy lowers undesirably.

Further, a treatment temperature in solution treatment (first) is set at 750° C. to 850° C. and a treatment temperature in solution treatment (second) is set at a temperature of not less than the treatment temperature in solution treatment (first) to less than 900° C. If at least one of the treatment temperatures of the solution treatment (first and second) is lower than the lowest temperature, the area ratio in cube orientation in a copper alloy can hardly be 45% or more and bending workability deteriorates. On the other hand, if at least one of the treatment temperatures of the solution treatment (first and second) is higher than the highest temperature, the possibility of increasing the average crystal grain size of a copper alloy to 40 μm or more increases and bending workability deteriorates.

A second copper alloy is produced by, after solution treatment, undergoing the processes of aging treatment, final cold rolling, and then low temperature annealing in the same way as the case of producing an ordinary copper alloy. It is desirable that an aging treatment temperature is 400° C. to 500° C. Further, a reduction ratio in final cold rolling is set at 25% to 60%. If a reduction ratio is lower than 25%, a KAM value lowers and strength also lowers. On the other hand, if a reduction ratio exceeds 60%, a KAM value exceeds 3.0 more frequently and a satisfactory bending workability is not obtained.

<Third Copper Alloy>

A third copper alloy according to the present invention is explained hereunder.

The present inventors have studied the production processes of a copper alloy, precisely investigated textures before and after final cold rolling in the production processes with an SEM-EBSP, and found that crystal grains still retaining a crystal orientation before rolling remain abundantly even when rolling is applied to a copper alloy. That is, it has been confirmed that the area ratio in cube orientation {001}<100> after final cold rolling can be kept at a high level if the area ratio of the cube orientation before the final cold rolling is high. A final reduction ratio is controlled low in order to control a texture in the technologies described in JP-A Nos. 2006-152392 and 2009-7666 shown earlier but the present inventors have found that it is possible to control a texture even when a final reduction ratio is increased in the production processes of a copper alloy.

Further, the present inventors, as a result of furthering studies, have found that bending workability improves insufficiently when the area ratio in cube orientation in the plate thickness direction varies and bending workability improves for certain by reducing the variation of the area ratio in cube orientation in the plate thickness direction.

Furthermore, it has been found that the area ratio in cube orientation can be increased as a crystal grain size increases. It has been verified that, in the case where a crystal grain size is not more than 40 μm in particular, the contribution of the increase in the area ratio in cube orientation to the improvement of bending workability exceeds the contribution of the coarsening of crystal grains to the deterioration of bending workability. Consequently, it has been found that bending workability can be retained sufficiently even when a crystal grain size is increased up to a certain size (40 μm) in order to improve stress relaxation resistance. Here, a crystal grain size can be increased by contriving a solution treatment method.

As a result of the findings through the above experiment and research, it has been found that a copper alloy simultaneously having a high strength, an excellent bending workability, and an excellent stress relaxation resistance, which are the challenges of the present invention, can be obtained by: setting the average crystal grain size of the copper alloy at 10 to 40 μm; setting the average area ratio in cube orientation {001}<100> at not less than 20% as a result of measurement by an SEM-EBSP method; further setting the difference in area ratio in cube orientation between a ¼t (t represents sheet thickness) part and a ½t part within 5%; and, in addition to those, setting a KAM (Kernel Average Misorientation) value at 1.00-3.00.

Embodiments of the third copper alloy are hereunder explained specifically for each requirement and firstly requirements on the texture of the third copper alloy are explained in sequence. Here, in the following explanations, when an average crystal grain size and an average area ratio in a texture are described, the term "average" may be omitted and merely a crystal grain size and an area ratio may be described occasionally.

(Average Crystal Grain Size)

The average crystal grain size of a copper alloy is set at 10 to 40 μm. If a crystal grain size is not more than 40 μm, the extent of the contribution of the increase in the area ratio in cube orientation to the improvement of bending workability exceeds the extent of the contribution of the coarsening of crystal grains to the deterioration of bending workability and the bending workability of a copper alloy improves. If a crystal grain size exceeds 40 μm however, the contribution of the coarsening of crystal grains comes to be predominant and bending workability deteriorates undesirably. Consequently, the upper limit of a crystal grain size is set at 40 μm. A preferable crystal grain size is 30 μm or less. On the other hand, if a crystal grain size is less than 10 μm, stress relaxation resistance deteriorates. A preferable crystal grain size is 15 μm or more.

(Average Area Ratio in Cube Orientation)

The cube orientation {001}<100> is an orientation where more slip systems can be active. By accumulating the cube orientation by 20% or more in terms of area ratio, it comes to be possible to inhibit local deformation from developing and improve the bending workability of a copper alloy. If the accumulation ratio (area ratio) of cube orientation grains is too low, local deformation cannot be inhibited from developing and the bending workability of a copper alloy deteriorates. Consequently in the present invention, the average area ratio in cube orientation {001}<100> is set at 20% or more and preferably 25% or more. Here, in the present invention, the upper limit of the average area ratio in cube orientation is not particularly limited but the area ratio in cube orientation is hardly set at 70% or more. Consequently, a substantial range of the area ratio in cube orientation is 20% to 70%.

(Difference in Area Ratio in Cube Orientation)

The area ratio in cube orientation at a ¼t (t represents sheet thickness) part and the area ratio in cube orientation at a ½t part are the area ratios of the same cube orientation but the area ratios may vary sometimes. If the difference (variation) in area ratio exceeds 5%, the bending workability of a copper alloy deteriorates. Consequently, it is necessary to inhibit the difference in area ratio in cube orientation within 5% and the bending workability of a copper alloy improves by setting the difference in area ratio in cube orientation within 5%.

(KAM Value)

A KAM value is set at 1.00 or more to not more than 3.00. If a KAM value is less than 1.00, a dislocation density is insufficient and hence proof stress decreases considerably in comparison with tensile strength. As a result, the proof stress in the direction perpendicular to the rolling direction decreases undesirably. Meanwhile, if a KAM value is larger than 3.00, a dislocation density increases excessively and bending workability deteriorates undesirably.

(Measurement Methods of Average Crystal Grain Size, Texture, and KAM Value)

The measurement methods of an average crystal grain size, a texture, and a KAM value are similar to the measurement methods in the first copper alloy and in the second copper alloy.

(Chemical Component Composition of Copper Alloy)

The reasons for limiting components of a third copper alloy are explained hereunder. The content (ratio) of each element below is described merely as % but % means mass % in all cases.

Ni: 2.0%-3.6%

Ni has the functions of securing the strength and electric conductivity of a copper alloy by crystallizing or precipitating a chemical compound with Si. If an Ni content is less than 2.0%, the quantity of generated precipitates is insufficient, an intended strength is not obtained, and crystal grains in a copper alloy texture coarsen undesirably. On the other hand, if an Ni content exceeds 3.6%, electric conductivity deteriorates, the number of coarse precipitates increases excessively, and bending workability deteriorates. Consequently, an Ni content is set in the range of 2.0%-3.6%.

Si: 0.4%-1.0%

Si improves the strength and electric conductivity of a copper alloy by crystallizing or precipitating a chemical compound with Ni. If an Si content is less than 0.4%, the generation of precipitates is insufficient, an intended strength is not obtained, and crystal grains in a copper alloy texture coarsen undesirably. On the other hand, if an Si content exceeds 1.0%, the number of coarse precipitates increases excessively and bending workability deteriorates. Consequently, an Si content is set in the range of 0.4%-1.0%.

Zn: 0.05%-3.0%

Zn is an element effective in improving the thermal exfoliation resistance of Sn plating and solder used for bonding an electronic component and inhibiting thermal exfoliation. In order to exhibit the effects effectively, Zn has to be contained by 0.05% or more. If a Zn content exceeds 3.0% however, the wet-spreadability of molten Sn and solder rather deteriorates and electric conductivity also deteriorates largely. Further, a cube orientation area ratio also lowers. Consequently, a Zn content is set in the range of 0.05%-3.0% in consideration of thermal exfoliation resistance improvement effect and electric conductivity deterioration function.

Sn: 0.05%-1.5%

Sn dissolves in a copper alloy and contributes to the improvement of strength. In order to exhibit the effects effectively, Sn has to be contained by 0.05% or more. If an Sn content exceeds 1.5% however, the effects are saturated and electric conductivity deteriorates largely. Further, a cube orientation area ratio lowers. Consequently, an Sn content is set in the range of 0.05%-1.5% in consideration of strength improvement effect and electric conductivity deterioration function.

A third copper alloy comprises, besides the above elements, copper and unavoidable impurities but the following elements may be contained individually or in combination.

One or More Elements of Fe, Mn, Mg, Co, Ti, Cr, and Zr: 0.01%-3.0% in Total

Those elements have the effect of micronizing crystal grains. Further, by forming a chemical compound with Si, strength and electric conductivity improve. In order to exhibit the effects effectively, it is necessary to selectively contain one or more elements of Fe, Mn, Mg, Co, Ti, Cr, and Zr by 0.01% or more in total. If the total content of those elements exceeds 3.0% however, a chemical compound coarsens and bending workability is hindered. Consequently, when those elements are contained selectively, the content of those elements is set in the range of 0.01% to 3.0% in total. Here, although the case of containing only one kind of the elements is referred to in the examples described below, the elements commonly exhibit the effects and similar effects are exhibited even when two or more kinds of the elements are contained within the total content range described above.

(Production Conditions)

A third copper alloy (copper alloy plate) can be produced through the processes of hot rolling, cold rolling, solution treatment, aging treatment, and cold rolling in the same way as the case of producing an ordinary copper alloy. The present inventors have earnestly studied the production conditions for producing a third copper alloy and resultantly verified that a copper alloy simultaneously having a high strength, an excellent bending workability, and an excellent stress relaxation resistance, which are intended in the present invention, can be produced by adopting the production conditions shown below. The production conditions are hereunder explained in detail.

Here, a third copper alloy is basically a rolled copper alloy plate and a strip formed by slitting it in the width direction and a substance formed by coiling the plate or the strip are also included in the third copper alloy.

Firstly, it is preferable to adopt a reduction ratio under a heavy reduction of 90% or more by increasing the reduction ratio at cold rolling succeeding to hot rolling to a level higher than a reduction ratio in the production of an ordinary copper alloy. When a reduction ratio does not reach 90%, crystal grains of cube orientation do not develop at solution treatment as the succeeding process and the variation in the area ratio of the crystal grains of cube orientation in the plate thickness direction is likely to increase.

The succeeding solution treatment is a process important for obtaining an intended crystal grain size and an intended texture. In particular, it is necessary to control a treatment temperature and a temperature increase rate in the solution treatment.

It is preferable to control a solution treatment temperature (T) in the range satisfying the conditional expression 40×Ni additive amount (mass %)+650≤T≤40×Ni additive amount (mass %)+740. If a solution treatment temperature (T) is lower than the lower limit temperature obtained with the conditional expression, the average crystal grain size of an obtained copper alloy is likely to be less than 10 μm and stress relaxation resistance is likely to be insufficient. Further, solution is processed insufficiently, precipitation is also insufficient at the succeeding aging treatment, and the strength of a copper alloy lowers undesirably. On the other hand, if a solution treatment temperature (T) is higher than the upper limit temperature obtained with the conditional expression, a crystal grain size is likely to exceed 40 μm and bending workability is likely to deteriorate.

A temperature increase rate at solution treatment is preferably 1° C./s or less. If a temperature increase rate is more than 1° C./s, the area ratio in cube orientation is likely to be small and bending workability deteriorates undesirably in some cases.

Further, a retention time after a solution treatment temperature T reaches a tidemark is preferably 5 to 30 min. If a retention time is less than 5 min., the temperature of a copper alloy is likely to vary in the plate thickness direction and the variation in the area ratio in cube orientation in the plate thickness direction is likely to increase. On the other hand, if a retention time exceeds 30 min., the average crystal grain size of a copper alloy is likely to increase and bending workability deteriorates undesirably in some cases.

A third copper alloy is produced by, after solution treatment, undergoing the processes of aging treatment, final cold rolling, (and low temperature annealing) or the processes of final cold rolling, aging treatment, (and low temperature annealing) in the same way as the production processes of an ordinary copper alloy. In the case of undergoing either of the processes, it is desirable that an aging temperature at aging treatment is 400° C. to 550° C. in the same way as the case of producing an ordinary copper alloy.

Further, in the case of undergoing either of the processes, it is preferable that a reduction ratio in final cold rolling is 30% to 60%. If a reduction ratio is less than 30%, a KAM value lowers to 1.0 or less, a 0.2% proof stress (YP) in the direction perpendicular to a rolling direction (T. D. direction) lowers, and strength is likely to lower. On the other hand, if a reduction ratio exceeds 60%, the average area ratio in cube orientation is likely to decrease and bending workability deteriorates in some cases.

As stated above, it is possible to apply low temperature annealing after final cold rolling with the aim of reducing the residual stress of a plate material and improving a spring bending elastic limit and a stress relaxation resistance. A heating temperature on this occasion is desirably 250° C. to 600° C. By the low temperature annealing, it is possible to reduce residual stress in the interior of a plate material and enhance bending workability and breaking elongation with scarcely accompanying the lowering of strength. Further, it is also possible to increase an electric conductivity. If a heating temperature is higher than 600° C. however, a KAM value is likely to lower and softening occurs. On the other hand, if a heating temperature is lower than 250° C., sufficient improvement effects of the above characteristics are hardly exhibited.

EXAMPLES

The present invention is hereunder explained more specifically on the basis of examples. The present invention however is not restricted from the beginning by the following examples and can be applied while modifications are arbitrarily added within the range conforming to the tenor of the present invention, and any of the modifications is included in the technological scope of the present invention.
<Test A: First Copper Alloy>

Copper alloy thin plates of Cu—Ni—Si—Zn—Sn system copper alloy having various chemical component compositions shown in Tables 1 and 2 are produced under various conditions shown in Tables 1 and 2. Then a plate structure such as an average crystal grain size and a texture and plate characteristics such as strength and electric conductivity, bending workability, and stress relaxation resistance are variously investigated and evaluated. The results are shown in Table 3.

In the concrete production method of copper alloy plates, cast ingots 50 mm in thickness having the chemical compositions described in Tables 1 and 2 are obtained by, in the atmosphere, being dissolved in the state of being covered with charcoal in a kryptol furnace and being cast into a cast-iron book mold. Then, after the surface of each of the cast ingots is faced, the each cast ingot is hot rolled up to a thickness of 30 to 6 mm at a temperature of 950° C., cooled from a temperature of 750° C. or higher to 600° C. to 300° C. by air cooling, retained for 1 to 120 min. in a batch annealing furnace heated to 600° C. to 300° C., and thereafter rapidly cooled in water. Successively, after oxidized scale is removed, cold rolling is applied and plates 0.20 to 0.33 mm in thickness are obtained.

Successively, solution treatment is applied under various conditions described in Tables 1 and 2 with a batch furnace of a temperature increase rate of 0.03° C. to 0.05° C./s and a salt-bath furnace or an electric heater of a temperature increase rate of 10° C./s to 50° C./s and thereafter water cooling is applied.

The specimens after the solution treatment (annealing) undergo the processes of aging treatment and then final cold rolling or the processes of final cold rolling and then aging treatment and cold-rolled plates 0.15 mm in thickness are obtained. Final copper alloy plates are obtained by applying low temperature annealing treatment of 480° C.×30 s to the cold-rolled plates in a salt-bath furnace.
(Metallographic Structure)
Average crystal grain size and area ratios stipulated in the present invention:

A texture observation piece is taken from each of the obtained copper alloy thin plates and the average crystal grain size and the area ratios stipulated in the present invention are measured in the way described above by a crystal orientation analysis method with a field emission scanning electron microscope on which an electron back scattering pattern system is mounted. More specifically, the rolled surface of a copper alloy thin plate is mechanically polished, further polished by buffing, and successively electrolytically polished, and thus a surface-conditioned specimen is prepared. Successively, a crystal orientation and a crystal grain size are measured by an EBSP with an FESEM made by JEOL Ltd. (JEOL JSM 5410). The size of a measurement field is 300 μm×300 μm and the measurement interval is set at 0.5 μm.

The size of a measurement field is 300 μm×300 μm and the measurement interval is set at 0.5 μm. Measurement faces are picked up from three points at each of a ¼t part and a ½t part in the plate thickness direction and an area ratio stipulated in the present invention is computed by averaging the area ratios at the six points in total.

Tensile Test:

A JIS #13 B test piece the longitudinal direction of which is the rolling direction is subjected to tensile test under the conditions of room temperature, a test rate of 10.0 mm/min., and GL=50 mm with a 5882 type universal test machine made by Instron Japan Co., Ltd. and a 0.2% proof stress (MPa) is measured. Here in the tensile test, three test pieces of identical conditions are tested and the average value of the test results is adopted.

Electric Conductivity:

An electric conductivity is obtained by milling a test piece the longitudinal direction of which is the rolling direction and thus forming a strip-shaped test piece 10 mm in width and 300 mm in length, measuring electric resistance with a double bridge type resistance measurement device, and computing by an average cross-sectional method. Here, in the measurement too, three test pieces of identical conditions are measured and the average value of the measurement results is adopted.

Bending Workability:

The bending test of a copper alloy plate specimen is carried out by the following method. A plate material 10 mm in width and 30 mm in length is cut out from a copper alloy plate specimen and 90° bending is applied in GoodWay (bending axis is perpendicular to the rolling direction) at a bending radius of 0.15 mm while a load of 1,000 kgf (about 9,800 N) is imposed. Successively, 180° closely contact bending is applied while a load of 1,000 kgf (about 9,800 N) is imposed and existence of cracking at a bent part is visually observed with an optical microscope of 50 magnifications. On that occasion, cracking is evaluated by the evaluation criteria A to E described in JBMA-T307 of Japan Copper and Brass Association Technical Standard.

Figure 2:
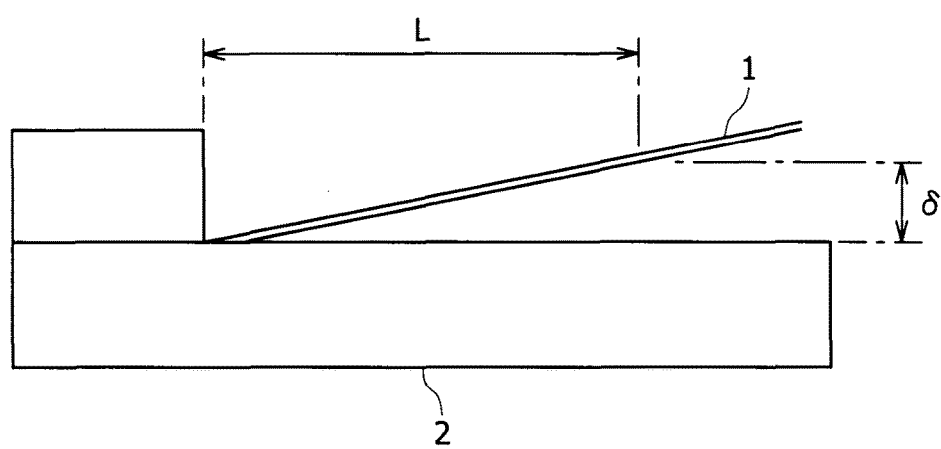
FIG. 2 is a front view showing a test method for obtaining the stress relaxation resistance of a copper alloy and permanent deflection when an amount of deflection is removed in an example.

Stress Relaxation Resistance:

A stress relaxation resistance (stress relaxation rate) is measured by taking a test piece from a copper alloy plate specimen and using a cantilever beam method as shown in FIGS. 1 and 2. More specifically, firstly a strip-shaped test piece 1 10 mm in width is cut out from a copper alloy plate specimen so that the longitudinal direction may be perpendicular to the rolling direction of the plate material. Successively, an end of the strip-shaped test piece 1 is fixed to a rigid test bed 2 and thereafter a deflection in the magnitude of d (=10 mm) is applied at the portion of the span length L of the strip-shaped test piece 1 as shown in FIG. 1. Here, the span length L is decided so that a surface stress corresponding to 80% of a material proof stress may be loaded on the material. The strip-shaped test piece 1 is retained for 24 hours at 180° C. in an oven in the state and thereafter taken out, a permanent strain □ (shown in FIG. 2) when the deflection d is removed is measured, and a stress relaxation rate (RS: %) is obtained from the computation expression RS=(□/d)×100.

As a result of the above tests, a copper alloy that has a 0.2% proof stress (YP) in the direction perpendicular to a rolling direction (T. D. direction) of not less than 650 MPa in tensile test, has an electric conductivity of 30% IACS or more, is evaluated as A or B in bending test, and has a stress relaxation rate of 20% or less or a copper alloy that has a 0.2% proof stress (YP) in the direction perpendicular to a rolling direction (T. D. direction) of not less than 700 MPa in tensile test, has an electric conductivity of 30% IACS or more, is evaluated as A to C in bending test, and has a stress relaxation rate of 20% or less is evaluated as a copper alloy according the present invention having a high strength, a high electric conductivity, an excellent bending workability, and an excellent stress relaxation resistance simultaneously.

TABLE 1

| Specimen No. | Chemical composition (mass %) | | | | | Hot rolling | | Solution treatment | | | Aging ° C. | Final cold rolling % |
|---|---|---|---|---|---|---|---|---|---|---|---|---|
| | Ni | Si | Zn | Sn | Fe, Mg, Co, Cr, Zr | Retention temperature (° C.) | Retention time min. | Temperature (° C.) | Temperature increase rate ° C./s | Temperature decrease rate ° C./s | | |
| Example 1A | 3.2 | 0.7 | — | 0.20 | — | 500 | 120 | 840 | 0.03 | 100 | 450 | 45 |
| 2A | 3.5 | 0.8 | — | 0.20 | — | 500 | 120 | 860 | 0.03 | 100 | 450 | 35 |
| 3A | 3.2 | 0.7 | 1.0 | — | — | 500 | 120 | 840 | 0.03 | 100 | 450 | 55 |
| 4A | 3.5 | 0.8 | 0.5 | 0.20 | — | 500 | 120 | 870 | 0.03 | 100 | 450 | 30 |
| 5A | 1.8 | 0.4 | 1.0 | 0.20 | — | 500 | 15 | 780 | 0.03 | 100 | 450 | 55 |
| 6A | 3.5 | 0.7 | — | — | — | 600 | 120 | 820 | 0.03 | 100 | 450 | 45 |
| 7A | 2.5 | 0.6 | 1.0 | 0.20 | — | 400 | 120 | 820 | 0.03 | 100 | 450 | 55 |
| 8A | 2.5 | 0.6 | 1.0 | 0.20 | — | 500 | 120 | 820 | 0.05 | 100 | 450 | 45 |
| 9A | 2.5 | 0.6 | 1.0 | 0.20 | — | 500 | 120 | 780 | 0.03 | 100 | 450 | 50 |
| 10A | 2.5 | 0.6 | 1.0 | 0.20 | — | 500 | 120 | 870 | 0.03 | 100 | 450 | 35 |
| 11A | 2.5 | 0.6 | 1.0 | 0.20 | — | 500 | 120 | 820 | 0.10 | 100 | 450 | 40 |
| 12A | 2.5 | 0.6 | 1.0 | 0.20 | Co: 0.3 | 500 | 120 | 830 | 0.03 | 100 | 450 | 40 |
| 13A | 2.5 | 0.6 | 1.0 | 0.20 | Zr: 0.1 | 500 | 120 | 830 | 0.03 | 100 | 450 | 40 |
| 14A | 2.7 | 0.6 | 1.0 | 0.20 | Mg: 0.1 | 500 | 120 | 820 | 0.03 | 100 | 450 | 55 |
| 15A | 2.5 | 0.7 | — | 1.00 | Fe: 0.3 | 500 | 120 | 820 | 0.03 | 100 | 450 | 45 |
| 16A | 2.5 | 0.7 | — | 0.20 | Cr: 0.3 | 500 | 120 | 820 | 0.03 | 100 | 450 | 45 |
| 17A | 2.5 | 0.6 | — | 0.20 | Ti: 0.1 | 500 | 120 | 860 | 0.03 | 100 | 450 | 45 |
| 18A | 2.5 | 0.6 | — | 0.20 | Mn: 0.2 | 500 | 120 | 840 | 0.03 | 100 | 450 | 45 |
| Comparative example 19A | 4.2 | 1.0 | 1.0 | 0.20 | — | 500 | 120 | 880 | 0.03 | 100 | 450 | 45 |
| 20A | 0.8 | 0.2 | 1.0 | 0.20 | — | 500 | 120 | 750 | 0.03 | 100 | 450 | 45 |
| 21A | 3.2 | 1.4 | 1.0 | 0.20 | — | 500 | 120 | 860 | 0.03 | 100 | 450 | 45 |
| 22A | 2.7 | 0.2 | 1.0 | 1.10 | — | 500 | 120 | 800 | 0.03 | 100 | 450 | 45 |
| 23A | 2.0 | 0.4 | 1.0 | 3.50 | — | 500 | 120 | 780 | 0.03 | 100 | 450 | 45 |
| 24A | 2.5 | 0.6 | — | 0.20 | — | 700 | 120 | 820 | 0.03 | 100 | 450 | 45 |
| 25A | 2.5 | 0.6 | — | 0.20 | — | Nil | Nil | 820 | 0.03 | 100 | 450 | 45 |

TABLE 1-continued

| | Chemical composition (mass %) | | | | | Hot rolling | | Solution treatment | | | Aging ° C. | Final cold rolling % |
|---|---|---|---|---|---|---|---|---|---|---|---|---|
| Specimen No. | Ni | Si | Zn | Sn | Fe, Mg, Co, Cr, Zr | Retention temperature (° C.) | Retention time min. | Temperature (° C.) | Temperature increase rate ° C./s | Temperature decrease rate ° C./s | | |
| 26A | 2.5 | 0.6 | — | 0.20 | — | 300 | 120 | 820 | 0.03 | 100 | 450 | 45 |
| 27A | 2.5 | 0.6 | — | 0.20 | — | 500 | 1 | 820 | 0.03 | 100 | 450 | 45 |
| 28A | 2.5 | 0.6 | — | 0.20 | — | 500 | 120 | 920 | 0.03 | 100 | 450 | 45 |
| 29A | 2.5 | 0.6 | — | 0.20 | — | 500 | 120 | 740 | 0.03 | 100 | 450 | 45 |
| 30A | 2.5 | 0.6 | — | 0.20 | — | 500 | 120 | 820 | 10 | 100 | 450 | 45 |
| 31A | 2.5 | 0.6 | — | 0.20 | — | Nil | Nil | 820 | 10 | 100 | 450 | 45 |

TABLE 2

| Specimen No. | | Average crystal grain size D μm | Area ratio of crystal grains having grain sizes not less than twice the average crystal grain size (%) | Ratio of the area of cube orientation to the area of the crystal grains having grain sizes not less than twice the average crystal grain size (%) |
|---|---|---|---|---|
| Example | 1A | 8 | 9 | 79 |
| | 2A | 12 | 9 | 80 |
| | 3A | 10 | 7 | 91 |
| | 4A | 16 | 10 | 86 |
| | 5A | 13 | 6 | 57 |
| | 6A | 24 | 11 | 67 |
| | 7A | 16 | 7 | 84 |
| | 8A | 18 | 8 | 76 |
| | 9A | 6 | 5 | 68 |
| | 10A | 28 | 10 | 88 |
| | 11A | 20 | 4 | 64 |
| | 12A | 16 | 8 | 72 |
| | 13A | 18 | 5 | 75 |
| | 14A | 19 | 6 | 64 |
| | 15A | 16 | 7 | 68 |
| | 16A | 13 | 8 | 79 |
| | 17A | 16 | 9 | 84 |
| | 18A | 17 | 7 | 86 |
| Comparative example | 19A | 12 | 8 | 87 |
| | 20A | 17 | 1 | 6 |
| | 21A | 16 | 9 | 86 |
| | 22A | 21 | 2 | 15 |
| | 23A | 15 | 4 | 24 |
| | 24A | 14 | 4 | 10 |
| | 25A | 17 | 2 | 15 |
| | 26A | 16 | 3 | 16 |
| | 27A | 36 | 4 | 33 |
| | 28A | 58 | 4 | 80 |
| | 29A | 4 | 5 | 58 |
| | 30A | 20 | 2 | 43 |
| | 31A | 36 | 1 | 5 |

TABLE 3

| Specimen No. | | Tensile strength MPa (T.S.) | | Proof stress MPa (Y.P.) | | Electric conductivity % IACS | Closely contact bending evaluation | Stress relaxation resistance (%) |
|---|---|---|---|---|---|---|---|---|
| | | L.D. | T.D. | L.D. | T.D. | | | |
| Example | 1A | 774 | 762 | 750 | 731 | 41 | C | 14 |
| | 2A | 783 | 752 | 766 | 726 | 38 | C | 12 |
| | 3A | 765 | 748 | 755 | 732 | 41 | C | 18 |
| | 4A | 775 | 744 | 761 | 716 | 38 | C | 10 |
| | 5A | 705 | 688 | 661 | 652 | 40 | B | 15 |
| | 6A | 761 | 731 | 744 | 721 | 44 | C | 13 |
| | 7A | 755 | 738 | 749 | 731 | 39 | C | 15 |
| | 8A | 746 | 736 | 739 | 721 | 40 | C | 14 |
| | 9A | 721 | 715 | 719 | 702 | 40 | C | 18 |
| | 10A | 742 | 718 | 735 | 708 | 39 | C | 13 |
| | 11A | 736 | 709 | 722 | 704 | 39 | C | 18 |
| | 12A | 749 | 736 | 741 | 722 | 43 | C | 19 |
| | 13A | 733 | 719 | 725 | 708 | 41 | C | 18 |
| | 14A | 739 | 731 | 729 | 716 | 40 | C | 11 |
| | 15A | 743 | 725 | 731 | 718 | 41 | C | 14 |
| | 16A | 761 | 744 | 751 | 733 | 44 | C | 14 |
| | 17A | 768 | 751 | 756 | 737 | 35 | C | 14 |
| | 18A | 746 | 733 | 724 | 716 | 40 | C | 14 |
| Comparative example | 19A | 826 | 816 | 814 | 798 | 37 | D | 16 |
| | 20A | 520 | 498 | 489 | 477 | 49 | A | 16 |
| | 21A | 797 | 775 | 781 | 756 | 33 | D | 15 |
| | 22A | 651 | 629 | 618 | 608 | 42 | A | 14 |
| | 23A | 788 | 764 | 774 | 755 | 19 | E | 12 |
| | 24A | 738 | 721 | 736 | 717 | 41 | E | 15 |

TABLE 3-continued

| Specimen No. | Final characteristics | | | | | | |
|---|---|---|---|---|---|---|---|
| | Tensile strength MPa (T.S.) | | Proof stress MPa (Y.P.) | | Electric conductivity % IACS | Closely contact bending evaluation | Stress relaxation resistance (%) |
| | L.D. | T.D. | L.D. | T.D. | | | |
| 25A | 745 | 732 | 738 | 724 | 38 | D | 14 |
| 26A | 741 | 728 | 736 | 722 | 38 | D | 15 |
| 27A | 748 | 736 | 733 | 726 | 40 | D | 7 |
| 28A | 725 | 714 | 715 | 700 | 40 | E | 6 |
| 29A | 681 | 665 | 656 | 638 | 40 | B | 21 |
| 30A | 756 | 742 | 747 | 736 | 38 | E | 14 |
| 31A | 748 | 736 | 733 | 726 | 40 | D | 7 |

As shown in Tables 1 and 2, in each of the specimen Nos. 1A to 18A which are examples (invention examples), the chemical component composition, the average crystal grain size, the area ratio of the crystal grains having crystal grain sizes not less than twice the average crystal grain size, and the ratio of the area of cube orientation grains to the area of the crystal grains having crystal grain sizes not less than twice the average crystal grain size are controlled within the stipulated ranges respectively.

As a result, each of the specimen Nos. 1A to 4A and 6A to 18A satisfies the requirements for the first copper alloy such as the 0.2% proof stress (YP) in the direction perpendicular to a rolling direction (T. D. direction) being not less than 700 MPa in tensile test, the electric conductivity being 30% IACS or more, the evaluation of bending test being A to C, and the stress relaxation ratio being 20% or less.

Meanwhile, the specimen No. 5A satisfies the requirements for the first copper alloy such as the 0.2% proof stress (YP) in the direction perpendicular to a rolling direction (T. D. direction) being not less than 650 MPa in tensile test, the electric conductivity being 30% IACS or more, the evaluation of bending test being A or B, and the stress relaxation ratio being 20% or less.

On the other hand, in each of the specimen Nos. 19A to 23A which are comparative examples, the content of any one of the elements does not satisfy the ranges stipulated in the present invention. Further, in each of the specimen Nos. 24A to 31A, at least any one of the average crystal grain size, the area ratio of the crystal grains having crystal grain sizes not less than twice the average crystal grain size, and the ratio of the area of cube orientation grains to the area of the crystal grains having crystal grain sizes not less than twice the average crystal grain size cannot be controlled within the ranges stipulated for the first copper alloy.

As a result, in each of the comparative examples, as shown in Table 3, at least one of the requirements such as the 0.2% proof stress (YP) in the direction perpendicular to a rolling direction (T. D. direction) being not less than 650 MPa in tensile test, the electric conductivity being 30% IACS or more, the evaluation of bending test being A or B, and the stress relaxation ratio being 20% or less or the 0.2% proof stress (YP) in the direction perpendicular to a rolling direction (T. D. direction) being not less than 700 MPa in tensile test, the electric conductivity being 30% IACS or more, the evaluation of bending test being A to C, and the stress relaxation ratio being 20% or less cannot be satisfied.

<Test B: Second Copper Alloy> Hereunder 2011-40394

Copper alloy thin plates of Cu—Ni—Si—Zn—Sn system copper alloy having various chemical component compositions shown in Table 4 are produced under various conditions shown in Table 4. Then a plate structure such as an average crystal grain size, a texture, and a KAM value and plate characteristics such as strength and electric conductivity, bending workability, and stress relaxation resistance are variously investigated and evaluated. The results are shown in Tables 5 and 6.

In the concrete production method of copper alloy plates, cast ingots 50 mm in thickness having the chemical compositions described in Table 4 are obtained by, in the atmosphere, being dissolved in the state of being covered with charcoal in a kryptol furnace and being cast into a cast-iron book mold. Then, after the surface of each of the cast ingots is faced, the each cast ingot is hot rolled up to a thickness of 20 to 30 mm at a temperature of 950° C. and rapidly cooled from a temperature of 750° C. or higher in water. Successively, after oxidized scale on the surface is removed, cold rolling is applied until the thickness is reduced to 0.25 to 0.45 mm.

Successively, solution treatment (first) is applied under various conditions described in Table 4 with a batch furnace of a temperature increase rate of 0.03° C./s to 0.05° C./s and a salt-bath furnace or an electric heater of a temperature increase rate of 10° C./s to 50° C./s and thereafter water cooling is applied.

Successively, cold rolling is applied to the copper alloy plates and the thicknesses of the copper alloy plates are reduced to 0.2 to 0.35 mm. Successively, solution treatment (second) is applied under various conditions described in Table 4 with a batch furnace of a temperature increase rate of 0.03° C./s to 0.05° C./s and a salt-bath furnace or an electric heater of a temperature increase rate of 10° C./s to 50° C./s and thereafter water cooling is applied.

The specimens after the solution treatment (annealing) undergo the processes of aging treatment and then final cold rolling and copper alloy plates 0.15 mm in thickness are obtained. Final copper alloy plates are obtained by applying low temperature annealing treatment of 480° C.×30 s to the cold-rolled copper alloy plates in a salt-bath furnace.

(Metallographic Structure)
Average Crystal Grain Size, Average Area Ratios in Orientations, and KAM Value:

With regard to each of the copper alloy thin plates, an average crystal grain size and average area ratios in various orientations are measured in the same way as Test A.

Further, a KAM value is obtained by measuring orientation difference in crystal grains with an EBSP. A KAM value is defined with the expression $(\Sigma y)/n$ when the number of crystal grains is represented by n and an orientation difference of the crystal grains individually measured is represented by y.

Tensile Test:

Tensile test is carried out in the same way as Test A.

In the tensile test, in a case where an Ni content is 1.5% to 3.6% and an Si content is 0.3% to 1.0% and moreover at least either the condition that an Ni content is 1.5% or more to less than 2.0% or the condition that an Si content is 0.3% or more to less than 0.5% is satisfied, a 2% proof stress (YP) in the direction perpendicular to a rolling direction (T. D. direction) of 650 MPa or more is evaluated as high strength. Then in a case other than the above case, a 2% proof stress (YP) in the direction perpendicular to a rolling direction (T. D. direction) of 700 MPa or more is evaluated as high strength.

Electric Conductivity:

Electric conductivity is measured in the same way as Test A. In the measurement, a specimen having an electric conductivity of 30% IACS or more is evaluated as having a high electric conductivity.

Bending Workability:

Bending test is carried out in the same way as Test A except that the bending radius is set at 0.10 mm.

In the bending test, in a case where an Ni content is 1.5% to 3.6% and an Si content is 0.3% to 1.0% and moreover at least either the condition that an Ni content is 1.5% or more to less than 2.0% or the condition that an Si content is 0.3% or more to less than 0.5% is satisfied, a specimen rated as B or higher in the evaluation criteria described in JBMA-T307 of Japan Copper and Brass Association Technical Standard is evaluated as being excellent in bending workability. Then in a case other than the above case, a specimen rated as C or higher in the evaluation criteria described in JBMA-T307 of Japan Copper and Brass Association Technical Standard is evaluated as being excellent in bending workability.

Stress Relaxation Resistance:

A stress relaxation resistance (stress relaxation rate) is measured in the same way as Test A. In the measurement, a specimen having a stress relaxation rate of 20% or less is regarded as being excellent in stress relaxation resistance.

TABLE 4

| | Specimen No. | Chemical composition (mass %) | | | | | First solution treatment | | Second solution treatment | | Final cold rolling % |
|---|---|---|---|---|---|---|---|---|---|---|---|
| | | Ni | Si | Zn | Sn | Fe, Co, Cr, Zr, Mn, Ti | Temperature (° C.) | Temperature increase rate ° C./s | Temperature (° C.) | Temperature increase rate ° C./s | |
| Invention example | 1B | 3.2 | 0.7 | — | 0.20 | — | 820 | 0.03 | 850 | 0.03 | 45 |
| | 2B | 3.5 | 0.8 | — | 0.20 | — | 840 | 0.03 | 860 | 0.03 | 30 |
| | 3B | 3.2 | 0.7 | 1.0 | — | — | 820 | 0.03 | 840 | 0.03 | 50 |
| | 4B | 1.8 | 0.4 | 1.0 | 0.20 | — | 760 | 0.03 | 800 | 0.03 | 55 |
| | 5B | 3.5 | 0.7 | — | — | — | 820 | 0.03 | 880 | 0.03 | 50 |
| | 6B | 2.5 | 0.6 | 1.0 | 0.20 | — | 820 | 0.05 | 840 | 0.05 | 45 |
| | 7B | 2.5 | 0.6 | 1.0 | 0.20 | — | 820 | 0.05 | 860 | 0.05 | 45 |
| | 8B | 2.5 | 0.6 | 1.0 | 1.25 | — | 820 | 0.05 | 840 | 0.05 | 35 |
| | 9B | 2.5 | 0.7 | — | 1.00 | Fe: 0.3 | 820 | 0.03 | 840 | 0.03 | 40 |
| | 10B | 2.5 | 0.6 | 1.0 | 0.20 | Co: 0.3 | 830 | 0.03 | 860 | 0.03 | 45 |
| | 11B | 2.5 | 0.6 | 1.0 | 0.20 | Zr: 0.1 | 830 | 0.03 | 850 | 0.03 | 45 |
| | 12B | 2.5 | 0.7 | — | 1.00 | Cr: 0.3 | 820 | 0.03 | 860 | 0.03 | 40 |
| | 13B | 2.5 | 0.6 | 1.0 | 0.20 | Ti: 0.1 | 840 | 0.03 | 860 | 0.03 | 45 |
| | 14B | 2.7 | 0.6 | 1.0 | 0.20 | Mg: 0.1 | 840 | 0.03 | 860 | 0.03 | 35 |
| | 15B | 2.5 | 0.6 | — | 0.20 | Mn: 0.2 | 820 | 0.03 | 840 | 0.03 | 45 |
| Comparative example | 16B | 4.2 | 1.0 | 1.0 | 0.20 | — | 840 | 0.03 | 880 | 0.03 | 45 |
| | 17B | 0.8 | 0.2 | 1.0 | 0.20 | — | 750 | 0.03 | 780 | 0.03 | 45 |
| | 18B | 3.2 | 1.4 | 1.0 | 0.20 | — | 840 | 0.03 | 880 | 0.03 | 45 |
| | 19B | 2.7 | 0.2 | 1.0 | 0.20 | — | 780 | 0.03 | 820 | 0.03 | 45 |
| | 20B | 2.0 | 0.4 | 1.0 | 3.50 | — | 820 | 0.03 | 860 | 0.03 | 45 |
| | 21B | 2.5 | 0.6 | 1.0 | 0.20 | — | 700 | 0.03 | 840 | 0.03 | 45 |
| | 22B | 2.5 | 0.6 | 1.0 | 0.20 | — | 860 | 0.03 | 880 | 0.03 | 45 |
| | 23B | 2.5 | 0.6 | 1.0 | 0.20 | — | 720 | 0.03 | 780 | 0.03 | 45 |
| | 24B | 2.5 | 0.6 | 1.0 | 0.20 | — | 820 | 10 | 840 | 0.03 | 45 |
| | 25B | 2.5 | 0.6 | 1.0 | 0.20 | — | 820 | 0.03 | 780 | 0.03 | 50 |
| | 26B | 2.5 | 0.6 | 1.0 | 0.20 | — | 820 | 0.03 | 920 | 0.03 | 45 |
| | 27B | 2.5 | 0.6 | 1.0 | 0.20 | — | 820 | 0.03 | 840 | 10 | 45 |
| | 28B | 2.5 | 0.6 | 1.0 | 0.20 | — | 820 | 0.03 | 840 | 0.03 | 20 |
| | 29B | 2.5 | 0.6 | 1.0 | 0.20 | — | 820 | 0.03 | 820 | 0.03 | 70 |

TABLE 5

| | Specimen No. | Average crystal grain size μm | Orientation grain average area ratio (%) | | | | | Cube orientation ratio | KAM value |
|---|---|---|---|---|---|---|---|---|---|
| | | | Cube | Brass | S | Copper | Goss | | |
| Invention example | 1B | 22 | 51 | 7 | 19 | 5 | 1 | 61 | 2.28 |
| | 2B | 25 | 55 | 6 | 17 | 3 | 1 | 67 | 1.86 |
| | 3B | 21 | 50 | 7 | 20 | 4 | 1 | 61 | 2.23 |
| | 4B | 26 | 46 | 9 | 19 | 6 | 1 | 57 | 2.48 |
| | 5B | 34 | 56 | 8 | 20 | 4 | 2 | 62 | 2.37 |
| | 6B | 22 | 49 | 5 | 21 | 4 | 1 | 61 | 2.26 |
| | 7B | 28 | 53 | 6 | 19 | 3 | 1 | 65 | 2.30 |
| | 8B | 18 | 45 | 10 | 22 | 5 | 1 | 54 | 2.02 |
| | 9B | 18 | 48 | 8 | 18 | 7 | 0 | 59 | 2.33 |

TABLE 5-continued

| Specimen No. | | Average crystal grain size μm | Orientation grain average area ratio (%) | | | | | Cube orientation ratio | KAM value |
|---|---|---|---|---|---|---|---|---|---|
| | | | Cube | Brass | S | Copper | Goss | | |
| | 10B | 18 | 51 | 8 | 17 | 4 | 1 | 63 | 2.13 |
| | 11B | 17 | 48 | 6 | 23 | 3 | 1 | 59 | 2.16 |
| | 12B | 18 | 52 | 7 | 18 | 5 | 2 | 62 | 2.25 |
| | 13B | 19 | 48 | 12 | 19 | 4 | 1 | 57 | 2.31 |
| | 14B | 31 | 48 | 8 | 18 | 5 | 1 | 60 | 2.30 |
| | 15B | 22 | 48 | 7 | 18 | 6 | 1 | 60 | 2.29 |
| Comparative example | 16B | 26 | 50 | 10 | 18 | 6 | 1 | 59 | 2.36 |
| | 17B | 28 | 46 | 6 | 22 | 5 | 3 | 56 | 2.31 |
| | 18B | 25 | 51 | 7 | 21 | 7 | 1 | 59 | 2.26 |
| | 19B | 26 | 52 | 9 | 17 | 7 | 1 | 60 | 2.21 |
| | 20B | 23 | 9 | 18 | 24 | 8 | 2 | 15 | 2.33 |
| | 21B | 18 | 29 | 6 | 22 | 5 | 2 | 45 | 2.29 |
| | 22B | 42 | 59 | 4 | 16 | 6 | 1 | 69 | 2.30 |
| | 23B | 10 | 18 | 8 | 22 | 5 | 1 | 33 | 2.30 |
| | 24B | 31 | 28 | 8 | 21 | 5 | 2 | 44 | 2.31 |
| | 25B | 13 | 22 | 8 | 18 | 4 | 1 | 42 | 2.34 |
| | 26B | 44 | 56 | 5 | 19 | 3 | 2 | 66 | 2.25 |
| | 27B | 28 | 31 | 7 | 20 | 4 | 1 | 49 | 2.29 |
| | 28B | 22 | 58 | 3 | 18 | 2 | 1 | 71 | 0.89 |
| | 29B | 22 | 33 | 11 | 23 | 7 | 1 | 44 | 3.08 |

TABLE 6

| Specimen No. | | Final characteristics | | | | | | |
|---|---|---|---|---|---|---|---|---|
| | | Tensile strength MPa (T.S.) | | Proof stress MPa (Y.P.) | | Electric conductivity | Closely contact bending | Stress relaxation |
| | | L.D. | T.D. | L.D. | T.D. | % IACS | evaluation | resistance (%) |
| Invention example | 1B | 766 | 744 | 752 | 730 | 41 | C | 13 |
| | 2B | 774 | 748 | 758 | 722 | 38 | C | 10 |
| | 3B | 751 | 744 | 732 | 722 | 41 | C | 16 |
| | 4B | 689 | 677 | 682 | 659 | 40 | B | 16 |
| | 5B | 752 | 735 | 741 | 718 | 45 | C | 14 |
| | 6B | 748 | 729 | 732 | 715 | 40 | C | 14 |
| | 7B | 753 | 736 | 742 | 721 | 40 | C | 9 |
| | 8B | 754 | 727 | 737 | 715 | 34 | C | 18 |
| | 9B | 762 | 743 | 750 | 732 | 35 | C | 17 |
| | 10B | 753 | 742 | 738 | 723 | 43 | C | 16 |
| | 11B | 742 | 722 | 730 | 713 | 42 | C | 17 |
| | 12B | 772 | 756 | 762 | 733 | 34 | C | 18 |
| | 13B | 764 | 749 | 755 | 731 | 33 | C | 17 |
| | 14B | 756 | 721 | 741 | 709 | 40 | C | 13 |
| | 15B | 756 | 728 | 733 | 718 | 40 | C | 15 |
| Comparative example | 16B | 828 | 808 | 815 | 775 | 37 | D | 17 |
| | 17B | 522 | 501 | 511 | 482 | 49 | A | 14 |
| | 18B | 794 | 776 | 782 | 760 | 34 | D | 16 |
| | 19B | 637 | 598 | 622 | 581 | 42 | A | 16 |
| | 20B | 779 | 756 | 766 | 751 | 19 | E | 16 |
| | 21B | 748 | 730 | 735 | 720 | 41 | D | 18 |
| | 22B | 752 | 734 | 745 | 728 | 38 | D | 8 |
| | 23B | 711 | 682 | 692 | 664 | 38 | C | 22 |
| | 24B | 756 | 728 | 735 | 722 | 40 | D | 12 |
| | 25B | 733 | 715 | 718 | 705 | 40 | D | 25 |
| | 26B | 759 | 746 | 751 | 726 | 38 | D | 7 |
| | 27B | 742 | 728 | 736 | 721 | 38 | D | 17 |
| | 28B | 712 | 668 | 682 | 642 | 38 | B | 17 |
| | 29B | 817 | 809 | 812 | 802 | 38 | E | 16 |

In each of the invention examples 1B to 15B shown in Table 4, the average crystal grain size, the average area ratio in cube orientation, and the KAM value are controlled within the stipulated ranges respectively as shown in Table 5.

As a result, in the invention examples, the acceptance criteria of the second copper alloy are satisfied as shown in Table 6.

On the other hand, in the comparative examples 16B to 19B, the content of any one of the alloying elements does not satisfy the ranges stipulated in the present invention. Meanwhile, in the comparative examples 20B to 29B, at least any one of the average crystal grain size, the average area ratio in cube orientation, and the KAM value cannot be controlled within the ranges stipulated in the second copper alloy.

As a result, in the comparative examples, at least one of the acceptance criteria of the second copper alloy cannot be satisfied as shown in Table 6.

<Test C: Third Copper Alloy>

Copper alloy thin plates of Cu—Ni—Si—Zn—Sn system copper alloy having various chemical component compositions shown in Tables 7 and 8 are produced under various conditions shown in Tables 7 and 8. Then a plate structure such as an average crystal grain size, a texture, and a KAM value and plate characteristics such as strength and electric conductivity, bending workability, and stress relaxation resistance are variously investigated and evaluated. The results are shown in Tables 9 to 12.

In the concrete production method of copper alloy plates, cast ingots 50 mm in thickness having the chemical compositions described in Tables 7 and 8 are obtained by, in the atmosphere, being dissolved in the state of being covered with charcoal in a kryptol furnace and being cast into a cast-iron book mold. Then, after the surface of each of the cast ingots is faced, the each cast ingot is hot rolled up to a thickness of 600 to 1.25 mm at a temperature of 950° C. and rapidly cooled from a temperature of 750° C. or higher in water. Successively, after oxidized scale is removed, cold rolling is applied and plates 0.20 to 0.33 mm in thickness are obtained.

Successively, solution treatment is applied under various conditions described in Tables 7 and 8 with a batch furnace of a temperature increase rate of 0.03° C./s to 0.05° C./s and a salt-bath furnace or an electric heater of a temperature increase rate of 10° C./s to 50° C./s and thereafter water cooling is applied.

The specimens after the solution treatment (annealing) undergo the processes of aging treatment and then final cold rolling or the processes of final cold rolling and then aging treatment and cold-rolled plates 0.15 mm in thickness are obtained. Final copper alloy plates are obtained by applying low temperature annealing treatment of 480° C.×30 s to the cold-rolled plates in a salt-bath furnace.

(Metallographic Structure)

Average Crystal Grain Size, Average Area Ratios in Orientations, and KAM Value:

With regard to each of the copper alloy thin plates, an average crystal grain size, average area ratios in various orientations, and a KAM value are measured in the same way as Tests A and B. Here, variation in cube orientation in the plate thickness direction is defined by difference between the average of the measurement data at three points in a ¼t part and the average of the measurement data at three points in a ½t part.

Tensile Test:

Tensile test is carried out in the same way as Tests A and B. As a result of the tensile test, a 0.2% proof stress (YP) in the direction perpendicular to a rolling direction (T. D. direction) of not less than 700 MPa is evaluated as high strength.

Electric Conductivity:

Electric conductivity is measured in the same way as Tests A and B. In the measurement, a specimen having an electric conductivity of 35% IACS or more is evaluated as having a high electric conductivity.

Bending Workability:

Bending test is carried out in the same way as Test A.

Stress Relaxation Resistance:

A stress relaxation resistance (stress relaxation rate) is measured in the same way as Tests A and B. In the measurement, a specimen having a stress relaxation rate of 20% or less is regarded as being excellent in stress relaxation resistance.

TABLE 7

| | | | | | | | | Reduction ratio before solution treatment (%) | Solution treatment | | | | | | | |
|---|---|---|---|---|---|---|---|---|---|---|---|---|---|---|---|---|
| | | Chemical composition (mass %) | | | | | | | Temperature T (° C.) | Computation expression temperature lower limit | Computation expression temperature upper limit | Temperature increase rate ° C./s | Temperature decrease rate ° C./s | Retention time min. | Aging ° C. | Final cold rolling % |
| Specimen No. | | Ni | Si | Zn | Sn | Fe, Mg, Co, Cr, Zr | | | | | | | | | | |
| Invention example | 1C | 3.2 | 0.7 | 1.0 | 0.20 | — | | 93 | 840 | 778 | 868 | 0.03 | 100 | 5 | 450 | 45 |
| | 2C | 3.2 | 0.7 | 1.0 | 0.20 | — | | 93 | 840 | 778 | 868 | 0.03 | 100 | 5 | 450 | 55 |
| | 3C | 3.6 | 1.0 | 0.5 | 0.20 | — | | 93 | 860 | 794 | 884 | 0.03 | 100 | 5 | 450 | 35 |
| | 4C | 3.5 | 0.7 | 1.0 | 0.05 | — | | 93 | 840 | 790 | 880 | 0.03 | 100 | 20 | 450 | 45 |
| | 5C | 3.6 | 1.0 | 0.5 | 0.20 | — | | 93 | 840 | 794 | 884 | 0.05 | 100 | 5 | 450 | 45 |
| | 6C | 2.7 | 0.6 | 1.0 | 0.05 | — | | 93 | 800 | 758 | 848 | 0.03 | 100 | 5 | 450 | 50 |
| | 7C | 2.5 | 0.5 | 1.0 | 0.50 | — | | 93 | 820 | 750 | 840 | 0.03 | 100 | 5 | 450 | 45 |
| | 8C | 2.5 | 0.5 | 1.0 | 1.50 | — | | 93 | 820 | 750 | 840 | 0.03 | 100 | 5 | 450 | 40 |
| | 9C | 2.5 | 0.6 | 1.0 | 0.20 | Co: 0.3 | | 93 | 830 | 750 | 840 | 0.03 | 100 | 5 | 450 | 40 |
| | 10C | 2.5 | 0.6 | 1.0 | 0.20 | Zr: 0.1 | | 93 | 830 | 750 | 840 | 0.03 | 100 | 5 | 450 | 40 |
| | 11C | 3.0 | 0.7 | 0.1 | 1.00 | Fe: 0.3 | | 93 | 840 | 770 | 860 | 0.03 | 100 | 5 | 450 | 45 |
| | 12C | 3.0 | 0.7 | 0.1 | 1.00 | Cr: 0.3 | | 93 | 840 | 770 | 860 | 0.03 | 100 | 5 | 450 | 45 |
| | 13C | 2.7 | 0.6 | 1.0 | 0.20 | Mg: 0.1 | | 93 | 820 | 758 | 848 | 0.03 | 100 | 5 | 450 | 55 |
| | 14C | 2.5 | 0.6 | 1.0 | 0.20 | Ti: 0.1 | | 93 | 860 | 750 | 840 | 0.03 | 100 | 5 | 450 | 45 |
| | 15C | 2.5 | 0.6 | 1.0 | 0.20 | Mn: 0.2 | | 93 | 840 | 750 | 840 | 0.03 | 100 | 5 | 450 | 45 |

TABLE 7-continued

| | | Chemical composition (mass %) | | | | Reduction ratio before solution treatment (%) | Solution treatment | | | | | | | Final cold rolling % |
|---|---|---|---|---|---|---|---|---|---|---|---|---|---|---|
| Specimen No. | | Ni | Si | Zn | Sn | Fe, Mg, Co, Cr, Zr | | Temperature T (° C.) | Computation expression temperature lower limit | Computation expression temperature upper limit | Temperature increase rate ° C./s | Temperature decrease rate ° C./s | Retention time min. | Aging ° C. | |
| Comparative example | 16C | 4.2 | 1.0 | 1.0 | 0.20 | — | 93 | 880 | 818 | 908 | 0.03 | 100 | 5 | 450 | 45 |
| | 17C | 0.8 | 0.2 | 1.0 | 0.20 | — | 93 | 750 | 682 | 772 | 0.03 | 100 | 5 | 450 | 45 |
| | 18C | 3.5 | 1.4 | 1.0 | 0.20 | — | 93 | 860 | 790 | 880 | 0.03 | 100 | 5 | 450 | 45 |
| | 19C | 2.6 | 0.3 | 1.0 | 1.10 | — | 93 | 800 | 754 | 844 | 0.03 | 100 | 5 | 450 | 45 |
| | 20C | 2.7 | 0.6 | 3.5 | 0.20 | — | 93 | 820 | 758 | 848 | 0.03 | 100 | 5 | 450 | 45 |
| | 21C | 2.0 | 0.4 | 1.0 | 3.50 | — | 93 | 800 | 730 | 820 | 0.03 | 100 | 10 | 450 | 45 |
| | 22C | 3.2 | 0.7 | 1.0 | 0.20 | — | 80 | 840 | 778 | 868 | 0.03 | 100 | 5 | 450 | 45 |
| | 23C | 3.2 | 0.7 | 1.0 | 0.20 | — | 93 | 740 | 778 | 868 | 0.03 | 100 | 5 | 450 | 45 |
| | 24C | 3.2 | 0.7 | 1.0 | 0.20 | — | 93 | 900 | 778 | 868 | 0.03 | 100 | 5 | 450 | 45 |
| | 25C | 3.2 | 0.7 | 1.0 | 0.20 | — | 93 | 840 | 778 | 868 | 10 | 100 | 5 | 450 | 45 |
| | 26C | 3.2 | 0.7 | 1.0 | 0.20 | — | 93 | 840 | 778 | 868 | 0.03 | 100 | 1 | 450 | 45 |
| | 27C | 3.2 | 0.7 | 1.0 | 0.20 | — | 93 | 840 | 778 | 868 | 0.03 | 100 | 45 | 450 | 45 |
| | 28C | 3.2 | 0.7 | 1.0 | 0.20 | — | 93 | 840 | 778 | 868 | 0.03 | 100 | 5 | 450 | 20 |
| | 29C | 3.2 | 0.7 | 1.0 | 0.20 | — | 93 | 840 | 778 | 868 | 0.03 | 100 | 5 | 450 | 70 |

TABLE 8

| | | Chemical composition (mass %) | | | | Reduction ratio before solution treatment (%) | Solution treatment | | | | | | Final cold rolling % | Aging ° C. |
|---|---|---|---|---|---|---|---|---|---|---|---|---|---|---|
| Specimen No. | | Ni | Si | Zn | Sn | Fe, Mg, Co, Cr, Zr | | Temperature T (° C.) | Computation expression temperature lower limit | Computation expression temperature upper limit | Temperature increase rate ° C./s | Temperature decrease rate ° C./s | Retention time min. | | |
| Invention example | 30C | 3.2 | 0.7 | 1.0 | 0.20 | — | 93 | 860 | 778 | 868 | 0.03 | 100 | 5 | 40 | 450 |
| | 31C | 3.2 | 0.7 | 1.0 | 0.20 | — | 93 | 840 | 778 | 868 | 0.03 | 100 | 5 | 50 | 450 |
| Comparative example | 32C | 3.2 | 0.7 | 1.0 | 0.20 | — | 93 | 840 | 778 | 868 | 0.03 | 100 | 5 | 20 | 450 |
| | 33C | 3.2 | 0.7 | 1.0 | 0.20 | — | 95 | 840 | 778 | 868 | 50 | 100 | 0 | 20 | 450 |

TABLE 9

| Specimen No. | | Crystal grain size μm | Orientation grain average area ratio (%) | | | | | KAM value |
|---|---|---|---|---|---|---|---|---|
| | | | Cube | Cube variation | Brass | S | Copper | Goss | |
| Invention example | 1C | 19 | 38 | 3 | 8 | 20 | 4 | 1 | 2.1 |
| | 2C | 18 | 34 | 2 | 11 | 19 | 3 | 1 | 2.4 |
| | 3C | 24 | 42 | 1 | 7 | 17 | 5 | 1 | 2.0 |
| | 4C | 26 | 43 | 3 | 10 | 20 | 7 | 2 | 2.1 |
| | 5C | 23 | 32 | 3 | 8 | 20 | 7 | 3 | 2.1 |
| | 6C | 12 | 22 | 4 | 6 | 24 | 5 | 1 | 2.1 |
| | 7C | 20 | 27 | 2 | 9 | 22 | 4 | 1 | 2.2 |
| | 8C | 18 | 26 | 1 | 8 | 25 | 4 | 1 | 2.0 |
| | 9C | 17 | 35 | 2 | 7 | 21 | 3 | 2 | 2.1 |
| | 10C | 18 | 32 | 2 | 8 | 22 | 3 | 2 | 2.0 |
| | 11C | 18 | 32 | 3 | 10 | 23 | 6 | 1 | 2.0 |
| | 12C | 15 | 29 | 2 | 10 | 22 | 6 | 1 | 2.1 |
| | 13C | 22 | 25 | 1 | 6 | 25 | 7 | 3 | 2.4 |
| | 14C | 18 | 28 | 3 | 10 | 23 | 3 | 2 | 2.1 |
| | 15C | 21 | 26 | 2 | 12 | 18 | 5 | 1 | 2.2 |
| Comparative example | 16C | 22 | 38 | 2 | 12 | 19 | 6 | 2 | 2.0 |
| | 17C | 21 | 21 | 2 | 7 | 16 | 5 | 1 | 2.1 |
| | 18C | 18 | 28 | 4 | 12 | 24 | 7 | 1 | 2.2 |
| | 19C | 26 | 34 | 3 | 6 | 17 | 4 | 4 | 2.1 |
| | 20C | 21 | 16 | 4 | 20 | 26 | 7 | 3 | 2.1 |
| | 21C | 18 | 13 | 3 | 14 | 28 | 4 | 2 | 2.2 |
| | 22C | 23 | 10 | 4 | 6 | 28 | 7 | 1 | 2.1 |

TABLE 9-continued

| Specimen No. | Crystal grain size μm | Orientation grain average area ratio (%) | | | | | | KAM value |
|---|---|---|---|---|---|---|---|---|
| | | Cube | Cube variation | Brass | S | Copper | Goss | |
| 23C | 6 | 12 | 6 | 11 | 29 | 8 | 2 | 2.3 |
| 24C | 42 | 56 | 2 | 6 | 16 | 6 | 1 | 2.1 |
| 25C | 20 | 16 | 6 | 12 | 22 | 6 | 2 | 2.2 |
| 26C | 25 | 37 | 12 | 6 | 23 | 10 | 1 | 2.0 |
| 27C | 46 | 54 | 2 | 4 | 15 | 3 | 1 | 2.1 |
| 28C | 21 | 41 | 4 | 3 | 18 | 2 | 2 | 0.8 |
| 29C | 22 | 21 | 3 | 16 | 33 | 8 | 1 | 2.9 |

TABLE 10

| | Specimen No. | Crystal grain size μm | Orientation grain average area ratio (%) | | | | | | KAM value |
|---|---|---|---|---|---|---|---|---|---|
| | | | Cube | Cube variation | Brass | S | Copper | Goss | |
| Invention example | 30C | 31 | 45 | 3 | 7 | 17 | 6 | 1 | 1.8 |
| | 31C | 20 | 40 | 2 | 9 | 21 | 3 | 3 | 2.2 |
| Comparative example | 32C | 18 | 48 | 3 | 7 | 15 | 4 | 1 | 0.9 |
| | 33C | 7 | 38 | 2 | 8 | 20 | 4 | 2 | 0.8 |

TABLE 11

| | Specimen No. | Final characteristics | | | | | | | |
|---|---|---|---|---|---|---|---|---|---|
| | | Tensile strength MPa (T.S.) | | Proof stress MPa (Y.P.) | | Electric conductivity | Closely contact bending | Stress relaxation |
| | | L.D. | T.D. | L.D. | T.D. | % IACS | evaluation | resistance (%) |
| Invention example | 1C | 783 | 772 | 751 | 733 | 42 | C | 15 |
| | 2C | 807 | 802 | 758 | 752 | 40 | C | 19 |
| | 3C | 753 | 728 | 726 | 705 | 41 | B | 18 |
| | 4C | 743 | 731 | 725 | 716 | 43 | C | 13 |
| | 5C | 749 | 738 | 725 | 712 | 39 | C | 15 |
| | 6C | 733 | 714 | 716 | 703 | 45 | C | 20 |
| | 7C | 746 | 729 | 729 | 714 | 38 | C | 17 |
| | 8C | 762 | 748 | 744 | 728 | 32 | C | 18 |
| | 9C | 746 | 733 | 736 | 715 | 44 | C | 19 |
| | 10C | 741 | 728 | 726 | 711 | 41 | C | 19 |
| | 11C | 743 | 722 | 733 | 716 | 42 | C | 17 |
| | 12C | 762 | 743 | 738 | 726 | 42 | C | 18 |
| | 13C | 732 | 716 | 722 | 708 | 42 | C | 15 |
| | 14C | 743 | 733 | 732 | 716 | 36 | C | 18 |
| | 15C | 735 | 721 | 718 | 704 | 41 | C | 18 |
| Comparative example | 16C | 833 | 824 | 824 | 786 | 37 | D | 20 |
| | 17C | 533 | 512 | 486 | 472 | 49 | A | 20 |
| | 18C | 801 | 786 | 774 | 731 | 33 | C | 18 |
| | 19C | 660 | 634 | 621 | 613 | 42 | A | 18 |
| | 20C | 738 | 726 | 720 | 712 | 38 | D | 18 |
| | 21C | 806 | 785 | 772 | 751 | 19 | E | 14 |
| | 22C | 766 | 742 | 733 | 718 | 40 | D | 18 |
| | 23C | 717 | 701 | 688 | 668 | 39 | C | 27 |
| | 24C | 784 | 762 | 753 | 733 | 41 | E | 11 |
| | 25C | 786 | 776 | 753 | 729 | 42 | E | 18 |
| | 26C | 784 | 761 | 753 | 733 | 42 | E | 15 |
| | 27C | 768 | 736 | 742 | 721 | 40 | E | 13 |
| | 28C | 732 | 688 | 676 | 648 | 41 | B | 16 |
| | 29C | 826 | 820 | 816 | 809 | 40 | E | 19 |

TABLE 12

| Specimen No. | | Final characteristics | | | | | | |
|---|---|---|---|---|---|---|---|---|
| | | Tensile strength MPa (T.S.) | | Proof stress MPa (Y.P.) | | Electric conductivity | Closely contact bending | Stress relaxation |
| | | L.D. | T.D. | L.D. | T.D. | % IACS | evaluation | resistance (%) |
| Invention example | 30C | 787 | 734 | 743 | 702 | 39 | C | 15 |
| | 31C | 776 | 746 | 756 | 721 | 40 | C | 18 |
| Comparative example | 32C | 752 | 688 | 713 | 633 | 42 | A | 21 |
| | 33C | 766 | 697 | 702 | 648 | 41 | A | 19 |

In each of the invention examples 1C to 15C, 30C, and 31C shown in Tables 7 and 8, the average crystal grain size, the average area ratio in cube orientation, the difference (variation) in area ratio in cube orientation, and the KAM value are controlled within the stipulated ranges respectively as shown in Tables 9 and 10.

As a result, in the invention examples, the requirements for the third copper alloy such as the 0.2% proof stress (YP) in the direction perpendicular to a rolling direction (T. D. direction) being not less than 700 MPa, the electric conductivity being 30% IACS or more, the evaluation of bending workability being A to C, and the stress relaxation ratio being 20% or less are satisfied as shown in Tables 11 and 12.

On the other hand, in each of the comparative examples 16C to 21C, the content of any one of the elements does not satisfy the ranges stipulated for the third copper alloy. Further, in each of the comparative examples 22C to 29C, 32C, and 33C, at least any one of the average crystal grain size, the average area ratio in cube orientation, the difference (variation) in area ratio in cube orientation, and the KAM value cannot be controlled within the ranges stipulated for the third copper alloy.

As a result, in the comparative examples, as shown in Tables 11 and 12, at least one of the requirements such as the 0.2% proof stress (YP) in the direction perpendicular to a rolling direction (T. D. direction) being not less than 700 MPa, the electric conductivity being 35% IACS or more, the evaluation of bending workability being A to C, and the stress relaxation ratio being 20% or less cannot be satisfied.

What is claimed is:

1. A cold-rolled copper alloy consisting essentially of Ni: 1.5%-3.6% and Si: 0.3%-1.0% in terms of mass percent, copper and unavoidable impurities, wherein:
   the copper alloy contains Sn: 0.05%-3.0% and Zn: 0.05%-3.0% in terms of mass percent;
   the total content of Sn and Zn in the copper alloy is at least 1.1 mass %;
   the average crystal grain size of the crystal grains in the copper alloy is 12 to 30 μm;
   the area ratio of the crystal grains having crystal grain sizes not less than twice the average crystal grain size to the area of the total crystal grains is not less than 3%;
   the ratio of the area of cube orientation grains to the area of the crystal grains having crystal grain sizes not less than twice the average crystal grain size is not less than 50%;
   the electrical conductivity of the copper alloy is more than 35% IACS,
   the stress relaxation resistance is less than 20%, and
   the copper alloy has been subjected to a final cold rolling reduction of 35% to 60%, has a tensile strength in the rolling direction of no less than 733 MPa, and has a 0.2% proof stress in the direction perpendicular to the rolling direction of no less than 700 MPa;
   wherein the amount of Co in the copper alloy is no more than 0.3 mass %.

2. The copper alloy according to claim 1, wherein the copper alloy further contains one or more elements selected from the group consisting of Fe, Mn, Mg, Ti, Cr, and Zr by 0.01%-3.0% in terms of mass percent in total.

3. A cold-rolled copper alloy consisting essentially of Ni: 1.5%-3.6% and Si: 0.3%-1.0% in terms of mass percent, copper and unavoidable impurities, wherein:
   the copper alloy contains Sn: 0.05%-3.0% and Zn: 0.05%-3.0% in terms of mass percent;
   the total content of Sn and Zn in the copper alloy is at least 1.1 mass %;
   the average crystal grain size of the copper alloy is 15 to 40 μm;
   the average area ratio in cube orientation {001}<100> is not less than 45% as a result of measurement by an SEM-EBSP method;
   a KAM value is 1.0-3.0;
   the electrical conductivity of the copper alloy is more than 35% IACS;
   the stress relaxation resistance is less than 20%, and
   the copper alloy has been subjected to a final cold rolling reduction of 35% to 60%, has a tensile strength in the rolling direction of no less than 742 MPa, and has a 0.2% proof stress in the direction perpendicular to the rolling direction of no less than 700 MPa;
   wherein the amount of Co in the copper alloy is no more than 0.3 mass %.

4. The copper alloy according to claim 3, wherein the copper alloy further contains one or more elements selected from the group consisting of Fe, Mn, Mg, Ti, Cr, and Zr by 0.01%-3.0% in terms of mass percent in total.

5. A cold-rolled copper alloy consisting essentially of Ni: 2.0%-3.6%, Si: 0.4%-1.0%, Sn: 0.05%-1.5%, and Zn: 0.05%-3.0% in terms of mass percent, copper and unavoidable impurities, wherein:
   the total content of Sn and Zn in the copper alloy is at least 1.1 mass %;
   the average crystal grain size of the copper alloy is 12 to 40 μm;
   the average area ratio in cube orientation {001}<100> is not less than 20% as a result of measurement by an SEM-EBSP method;
   the average difference in area ratio in cube orientation measured at points at ¼ thickness of a sheet of the copper alloy and measured at points at ½ thickness of a sheet of the copper alloy is within 5%; and
   a KAM value is not less than 1.00 to not more than 3.00;
   the electrical conductivity of the copper alloy is more than 35% IACS, the stress relaxation resistance is less than 20%, and the copper alloy has been subjected to a final cold rolling reduction of 35% to 60%, has a tensile strength in the rolling direction of no less than 732 MPa, and has a 0.2% proof stress in the direction perpendicular to the rolling direction of no less than 700 MPa;

wherein the amount of Co in the copper alloy is no more than 0.3 mass %.

6. The copper alloy according to claim 5, wherein the copper alloy further contains one or more elements selected from the group consisting of Fe, Mn, Mg, Ti, Cr, and Zr by 0.01%-3.0% in terms of mass percent in total.

7. The copper alloy according to claim 1, wherein an average area ratio in cube orientation {001}<100> is not less than 45% as a result of measurement by an SEM-EBSP method.

8. The copper alloy according to claim 5, wherein the average area ratio in cube orientation {001}<100> is not less than 45% as a result of measurement by an SEM-EBSP method.

9. The copper alloy according to claim 1, wherein the total content of Sn and Zn in the copper alloy is at least 1.20 mass %.

10. The copper alloy according to claim 3, wherein the total content of Sn and Zn in the copper alloy is at least 1.20 mass %.

11. The copper alloy according to claim 5, wherein the total content of Sn and Zn in the copper alloy is at least 1.20 mass %.

* * * * *